(12) United States Patent
Mugino et al.

(10) Patent No.: US 6,343,088 B1
(45) Date of Patent: Jan. 29, 2002

(54) SEMICONDUCTOR LASER MODULE

(75) Inventors: Akira Mugino, Ichihara; Satoshi Koyanagi, Kisarazu; Takeo Shimizu, Fujisawa, all of (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/381,120
(22) PCT Filed: Jan. 25, 1999
(86) PCT No.: PCT/JP99/00267
§ 371 Date: Sep. 15, 1999
§ 102(e) Date: Sep. 15, 1999
(87) PCT Pub. No.: WO99/38235
PCT Pub. Date: Jul. 29, 1999

(30) Foreign Application Priority Data

Jan. 26, 1998 (JP) ............................................. 10-012903

(51) Int. Cl.[7] .................................................. H01S 5/00
(52) U.S. Cl. ......................................................... 372/49
(58) Field of Search ............................... 372/6, 48, 46, 372/50, 96, 49

(56) References Cited

FOREIGN PATENT DOCUMENTS

| JP | 54-150989 | 11/1979 |
|----|-----------|---------|
| JP | 5-82899 | 4/1993 |
| JP | 9-129979 | 5/1997 |
| JP | 9-162495 | 6/1997 |

OTHER PUBLICATIONS

T. Kato et al, "Multi–wavelength Bragg fiber–grating semiconductor laser array", Bulletin No. OPE97–1 of Society of Electronic Information and Communication, Technical Report of IEICE, pp. 1–6 ( May 1997).
T. Tanaka et al, "Uv written waveguide grating and its application to integrated external cavity lasers", Bulletin No. OPE97–2, Technical Report of IEICE, pp. 7–12 ( May 1997).
A. Hamakawa et al, "1480nm pump fiber–grating external–cavity–laser with two fiber gratings", 2nd Optoelectronics & Communications Conference, Technical Digest, pp. 224–225 (Jul. 1997).

*Primary Examiner*—Quyen Leung
(74) *Attorney, Agent, or Firm*—Frishauf, Holtz, Goodman, Langer & Chick, P.C.

(57) ABSTRACT

A semiconductor laser module 1 comprising a semiconductor laser device 2 having an emitting surface 2a from which excited light is emitted and a reflecting surface 2b opposite to the emitting surface, and an optical feedback medium 3 for feeding most of optical power emitted from the emitting surface 2a of the semiconductor laser device 2 back to the semiconductor laser device 2 by coupling means 4 and emitting part of the optical power. The semiconductor laser device 2 has a low reflectance multilayer coating 2c formed on the emitting surface 2a and having a reflectance of $10^{-4}$ to 10%. The low reflectance multilayer coating 2c has a reflection spectrum in the form of a curve having a maximum value at the central wavelength of reflection and minimum values on both sides of the central wavelength of reflection.

20 Claims, 18 Drawing Sheets

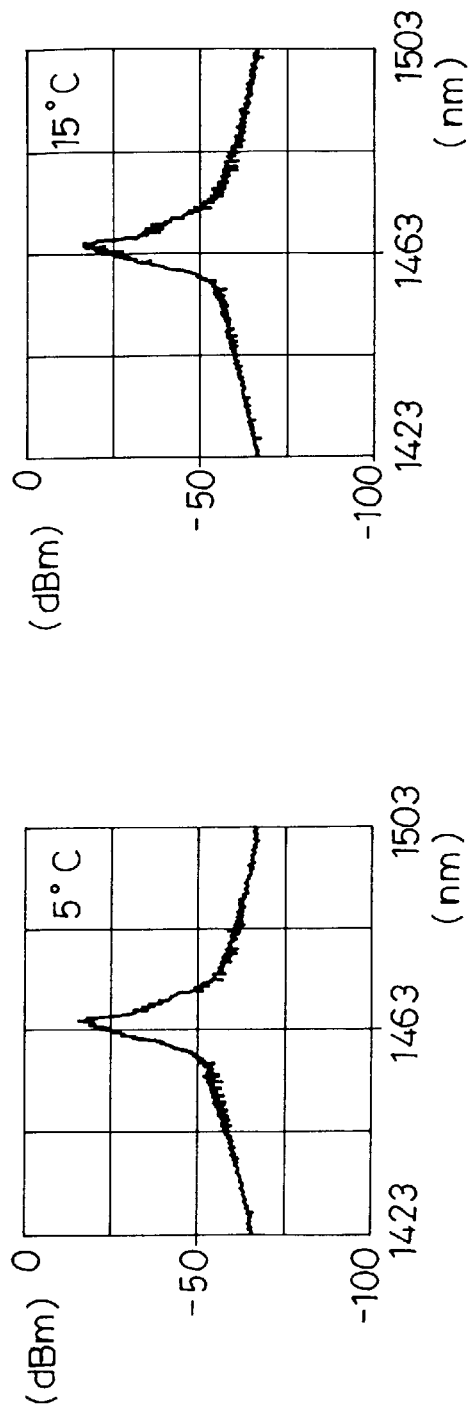
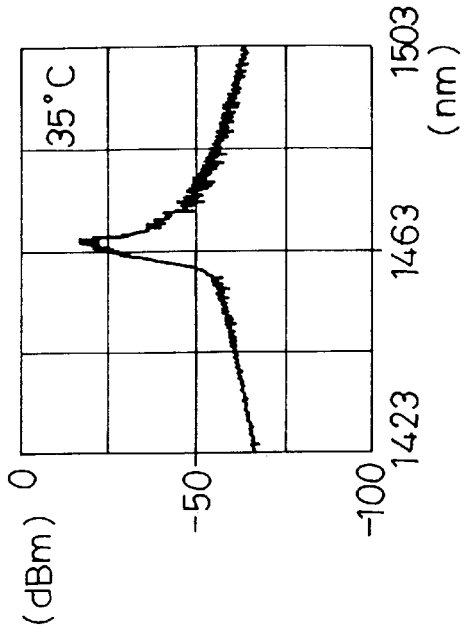
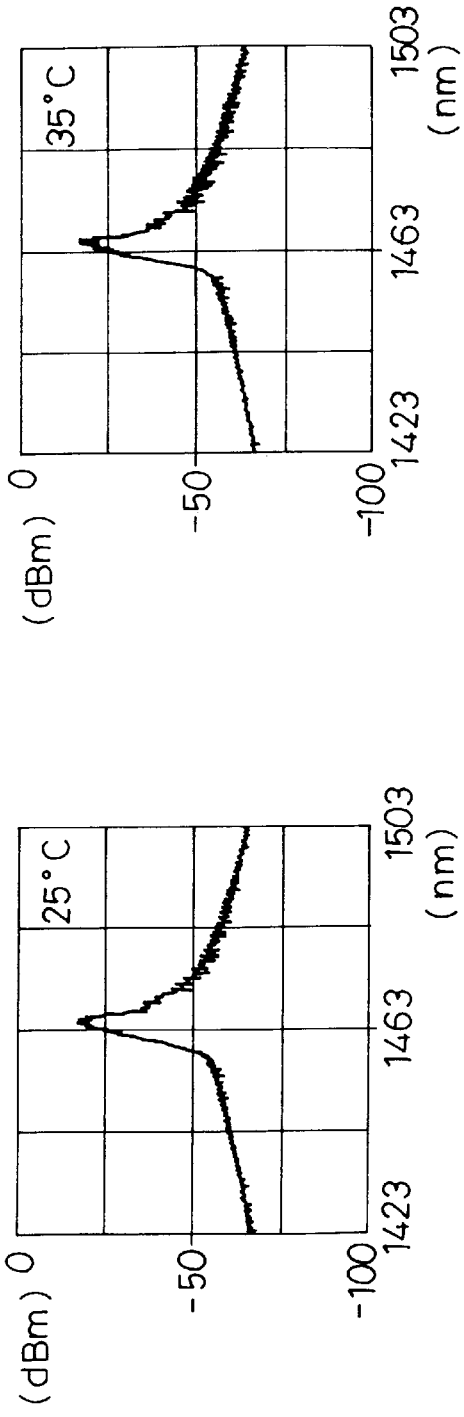
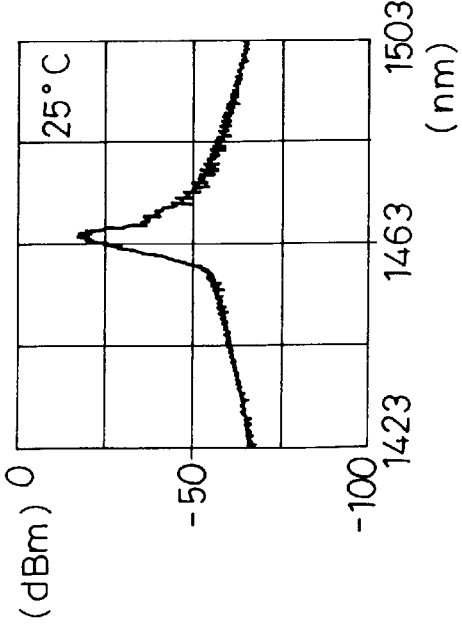

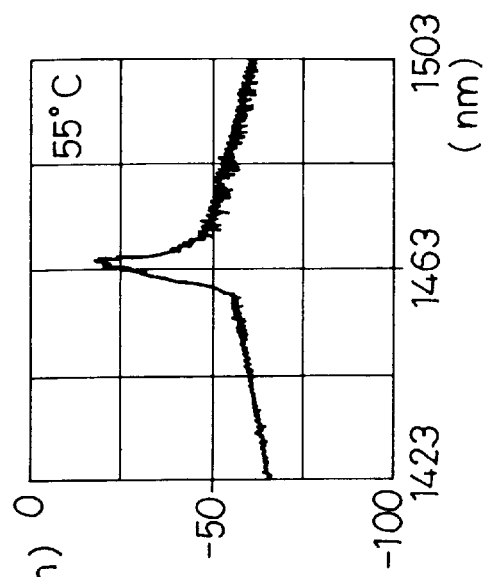
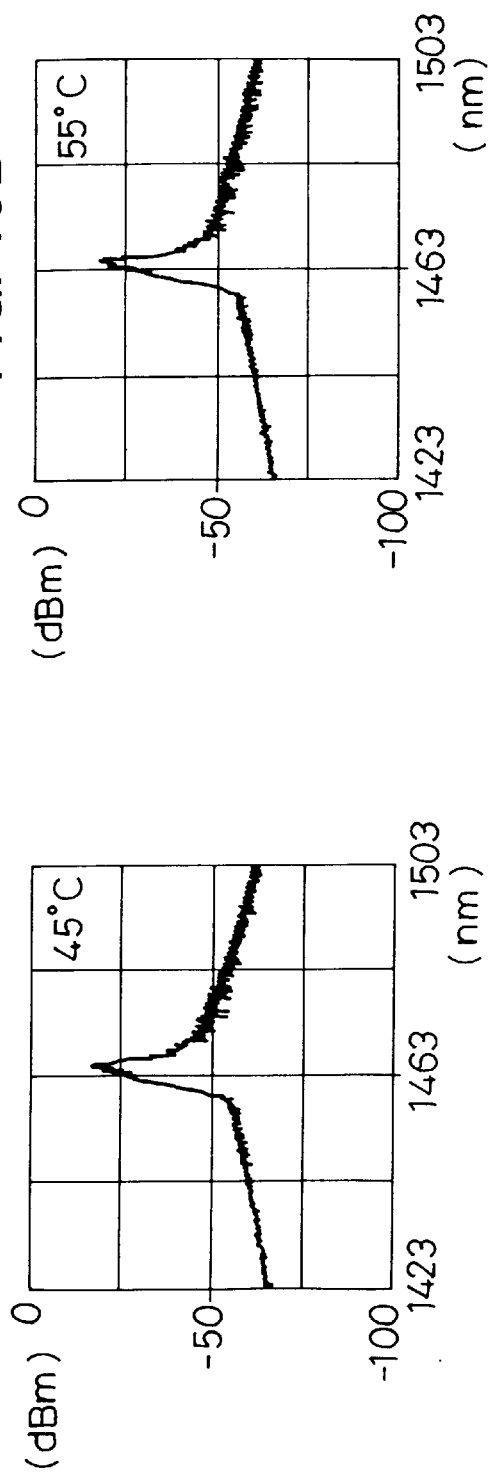
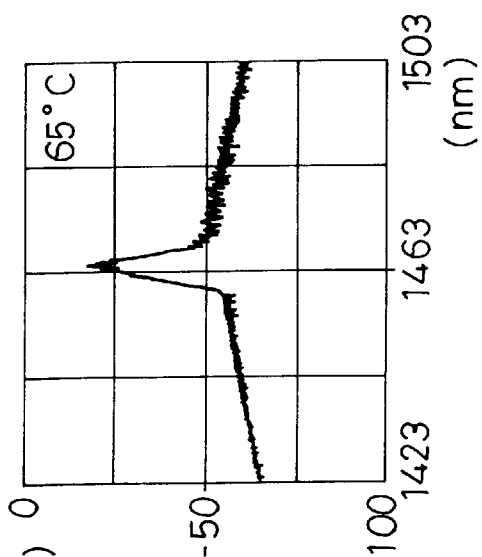

SEMICONDUCTOR LASER MODULE

TECHNICAL FIELD

The present invention relates to a semiconductor laser module for emitting a laser beam, and more specifically to a semiconductor laser module for an erbium doped fiber amplifier (EDFA) pumping purpose.

BACKGROUND ART

Conventionally, in order to stabilize the wavelength of light emitted from an emitting device, optical feedback method is generally used such that the light emitted from a multimode emission laser is partially reflected back to the laser thereby make the emission wavelength of the laser constant.

For examples, a semiconductor distributed feed back (DFB) laser, a distributed bragg reflector (DBR) laser, etc. belong to this classification. The DFB laser is a laser in which a diffraction grating is formed in an active layer of a semiconductor laser device. The DBR laser is a laser in which a reflecting diffraction grating which is, unlike an active layer, transparent in connection with emitted light is formed in a semiconductor laser device along its waveguide portion made of a semi-conducting medium, so that light may be reflected (fed back) to an active layer.

Further, in recent years, a fiber bragg grating, that is, an optical fiber whose core has a refractive index varied in its axial direction so that the optical fiber may have a function of optical diffraction is developing rapidly, and lasers using various fiber bragg gratings are already disclosed. For example, Bulletin No. OPE97-1 of Society of Electronic Information and Communication discloses a "fiber grating external resonator type multiwavelength laser array" by Kato et al., and Bulletin No. OPE97-2 thereof discloses a "UV induced waveguide grating and application thereof to an integrated external resonator type laser" by Tanaka et al.

Further, Atsushi Hamakawa et al. have reported on a technique of using an FBG to stabilize the emission wavelength of a 1480 nm-band pump laser which is to be used as a light source for EDFA pumping, in the 2nd Optoelectronics & Communications Conference (OECC '97), Technical Digest, July 1997, Seoul, Korea (classification 9D2-5, pages 224 to 225).

However, the above mentioned emitting devices such as the DFB laser and the DBR laser have a single mode emission spectrum. They are used exclusively for communication and not suitable for amplifying an EDFA.

Further, the above mentioned external resonator type lasers disclosed by Kato et al. and Tanaka et al. have the following problems.

1) Those external resonator type lasers are signal mode emission lasers, and mode hop, that is, a shift of central wavelength of emission happens when operating temperature changes by several degrees [C]. Thus, the stability of emission wavelength under change of temperature is low.

2) In those external resonator type lasers, the distance between an emitting surface of a laser device and a diffraction grating for optical feedback, which constitute an external resonator, is short. The process of assembling a module is therefore troublesome and needs special means such as a lensed fiber, flat mounting and the like. In other words, it is difficult to form the above mentioned external resonator type lasers using a two-lens compound confocal coupling system as used in an ordinary Fabry-Perot laser diode or an ordinary pump laser diode.

3) Output power of those external resonator type lasers is low. Therefore, they are not suited to be a light source for exciting an EDFA.

Further, the above mentioned technique on which Atsushi Hamakawa et al. have reported has the following problems though it is suitable for exciting an EDFA:

1) It needs to use, as a diffraction grating, a special fiber bragg grating capable of reflecting light of two different wavelengths.

2) Mode hop due to change of operating temperature is relatively small, but there still happens mode hop of about 2.6 nm.

The present invention has been made in consideration of the above problems. The object of the present invention is to provide a semiconductor laser module which has high power, shows high stability of emission wavelength under change of temperature, and is suited to be a light source for exciting an EDFA.

DISCLOSURE OF THE INVENTION

In order to attain the above object, the present invention provides a semiconductor laser module comprising a semiconductor laser device having an emitting surface from which excited light is emitted and a reflecting surface opposite to the emitting surface, and an optical feedback medium for feeding most of optical power emitted from the emitting surface of the semiconductor laser device back to the semiconductor laser device and emitting part of the optical power, wherein the semiconductor laser device has a first multilayer coating formed on the emitting surface and having a reflectance of $10^{-4}$ to 10% at the central wavelength of reflection, and the first multilayer coating has a reflection spectrum in the form of a curve having minimum values on both sides of the central wavelength of reflection.

In this semiconductor laser module according to the present invention, mode hop, that is, a shift of central wavelength of emission, caused by operating temperature of the semiconductor laser device itself is restrained.

Specifically, in an ordinary laser, light is reflected using a reflection reducing coating which does not have wavelength selectivity and has a flat reflection spectrum. For example, in a 1480 nm-band multimode emission semiconductor laser module, when the operating temperature changes within the range of 5 to 65° C., the central wavelength of emission spectrum shifts to the extent of about 30 nm at most.

In contrast thereto, in the semiconductor laser module of the present invention, the semiconductor laser device has, for example, a dielectric multilayer coating formed on its emission surface, and the dielectric multilayer coating has a reflection spectrum in the form of a curve having minimum values on both sides of the central wavelength of reflection and has a reflectance of $10^{-4}$ to 10% at the central wavelength of reflection. Therefore, in the semiconductor laser module of the present invention, the extent of a shift of central wavelength of emission spectrum of the semiconductor device under change of operating temperature is restrained to be small, that is, several nanometers at most.

It is desirable that the first multilayer coating has a reflection spectrum which has a maximum value near the central wavelength.

Further, it is desirable that the optical feedback medium is an optical waveguide or an optical fiber which has a core, a diffraction grating is formed in the core along the optical axis thereof, and the optical feedback medium is arranged to face the semiconductor laser device leaving a space of at least 10 mm as measured from the diffraction grating to the emitting surface of the semiconductor laser device.

Further, it is desirable that the semiconductor laser device has a second multilayer coating formed on its reflecting surface, and the second multilayer coating does not have wavelength selectivity and has a reflectance of 90 to 98%, so that the semiconductor laser device may have a multimode emission spectrum.

Due to the above described features imparted by the present invention, the semiconductor laser module of the present invention has high power, shows higher stability of emission wavelength under change of temperature, and is suited to be a light source for EDFA pumping.

Here, an example will be taken in which the optical feedback medium is arranged to face the semiconductor device leaving a space of at least 10 mm as measured from the diffraction grating to the emitting surface of the semiconductor device. The semiconductor laser device has a multimode emission spectrum, and its device length is 800 μm. When the semiconductor laser module operates in a compound resonance mode, the compound resonator length is 800 μm+10 mm (strictly, the length required for reflection by the diffraction grating is included), and the mode distance $\Delta\lambda 2$ is about 0.03 nm.

Here, if the semiconductor laser device is made to operate by itself, the mode distance $\Delta\lambda 1$ is given by $\Delta\lambda 1 \approx \lambda^2/(2n_{eq} \cdot L1)$, wherein $n_{eq}$ is the equivalent refractive index of a waveguide of the semiconductor laser device, λ the central wavelength of gain thereof, and L1 the device length thereof. For example, when the emission wavelength λ of the semiconductor laser device is 1485 nm, the equivalent refractive index $n_{eq}$ of the waveguide is 3.4 and the device length L1 is 300 μm, the mode distance $\Delta\lambda 1$ is about 1 nm, and when the device length L1 is 800 μm, the mode distance $\Delta\lambda 1$ is about 0.4 nm.

When mode hop is caused by disturbance such as change in operating temperature or injected current, the central wavelength of emission first hops to an adjacent mode. Therefore, when the device length L1 of the semiconductor laser device is 300~800 μm, mode hop happens at intervals of the mode distance $\Delta\lambda 1$ of at least 0.4 to 1 nm.

On the other hand, when the device length L1 of the semiconductor laser device is 800 μm and the distance from the emitting surface of the semiconductor laser device to the equivalent reflecting surface of the diffraction grating is 10 mm or more, the mode distance $\Delta\lambda 2$ is about 0.03 nm or less, which is very small. Therefore, even if mode hop happens in the semiconductor laser device in the semiconductor laser module, the emission wavelength of the semiconductor laser module changes little, and therefore the output power thereof changes very little.

Therefore, when the semiconductor laser module of the present invention is to be used as a light source for EDFA pumping, multimode emission is more advantageous than single mode emission because change in output power is smaller in multimode emission than in single mode emission.

Further, the semiconductor laser device is arranged such that the difference between the central wavelength of the gain spectrum thereof and the central wavelength of reflection of the diffraction grating is ±20 nm or less, and that the half width at half maximum of the gain spectrum band of the semiconductor laser device is 10 nm or larger, whether the semiconductor laser device may have bulk structure or quantum well structure.

Since the semiconductor laser device thus arranged and the optical feedback medium having the diffraction grating are combined, the semiconductor laser module of the present invention has an emission spectrum showing higher wavelength stability for the following reasons:

For general explanation, an example of 1480 nm-band multimode emission semiconductor laser module in which a semiconductor laser device and a fiber bragg grating (optical feedback medium) are combined will be taken. In this example, let it be supposed that the central wavelength λLD of gain spectrum of the semiconductor laser device is 1465 nm, the central wavelength λFg of reflection of the fiber bragg grating (hereinafter referred to as "FBG") is 1480 nm, the semiconductor laser device has Gaussian gain distribution, and a first multilayer coating has a fixed reflectance (for example, 1%) not depending on wavelengths.

In this case, there is a close relationship between the half width at half maximum of the gain spectrum band of the semiconductor laser device and the difference between the central wavelength λFg of reflection of the FBG and the central wavelength λLD of gain of the semiconductor laser device.

Here, the concept of pulling width will be explained.

In the above example, if the FBG is not provided, the emission wavelength of the semiconductor laser device is about 1465 nm. When the semiconductor laser device and the FGB are combined to form a compound resonator type laser, the relationship between the half width at half maximum of the gain spectrum and the pulling width is as shown in FIG. 1. Here, the compound resonator type laser has characteristic parameters as shown in FIG. 1. As indicated in FIG. 1, since the difference (λFg–λLD) between the central wavelength λFg of reflection of the FBG and the central wavelength λLD of gain of the semiconductor laser device is 15 nm, when the half width at half maximum of gain of the semiconductor device is about 23.5 nm or larger as read from graphs of "shorter wavelength side pulling width" and "longer wavelength side pulling width", the emission wavelength of the compound resonator type laser is not 1465 nm, but close to 1480 nm which is the central wavelength of reflection of the FBG.

Such is the emission wavelength pulling effect caused by the FBG, and the difference (λFg–λLD) between the central wavelength λFg of reflection of the FBG and the central wavelength λLD of gain of the semiconductor laser device is usually called "pulling widths".

Next, the present invention's principle as to how the emission wavelength of the compound resonator type laser formed by combining the semiconductor laser device and the FBG (optical feedback medium) is determined will be explained further in detail based on the relationship between gain and loss which is basic to the laser emission.

In order that the emission wavelength of the semiconductor laser device can be pulled into the central wavelength λFg of reflection of the FBG, it is necessary that a point of contact PC where a mirror loss curve CMR of the semiconductor laser module formed as the compound resonator type laser is in contact with a spectral curve CGS of net gain by certain injected current or carrier should always be at or near the central wavelength λFg of reflection of the FBG (depending on the half width at half maximum of reflection spectrum of the FBG, about ±2~3 nm or less) over the whole wavelength region of the semiconductor laser device.

Here, the gain of gain spectra in FIGS. 2, 4, 7 and 9 means so-called net gain G which is defined by the following expression:

$$G = \Gamma \times g \times L - \alpha i \times L \text{ (dimensionless)},$$

wherein Γ is a confinement coefficient of an active layer of the semiconductor laser device, g a gain coefficient (cm$^{-1}$) (it is to be noted that the half width at half maximum of gain spectrum as mentioned in claims refers to this g), L the device length of the semiconductor laser device (cm), and αi an absorption coefficient of the semiconductor laser device (cm$^{-1}$) relative to the total loss.

For example, a semiconductor laser module comprising a semiconductor laser device and a FBG will be taken in which the half width at half maximum of gain spectrum of the semiconductor laser device is 30 nm, a dielectric multilayer coating, for example, of $TiO_2$ and $SiO_2$ showing a reflectance of 1% at the central wavelength of reflection is formed on the emitting surface of the semiconductor laser device, the central wavelength λLD of gain of the semiconductor laser device is 1466 nm (as shown in FIG. 2) when the emission wavelength of the whole semiconductor laser module is 1485 nm, and the central wavelength λFg of reflection of the FBG is 1485 nm.

Using this semiconductor laser module, the central wavelength (nm) of gain of the semiconductor laser device and the emission wavelength (nm) of the whole semiconductor laser module were measured, and it was found that when the central wavelength λLD of gain of the semiconductor laser device was within the range of ΔA(1465.87 nm) to ΔB(1504.34 nm), the emission wavelength of the whole module was close to 1485 nm, as shown in FIG. 3. Since the central wavelength λFg of reflection of the FBG is 1485 nm, it turns out that the pulling width at half maximum WHP is 19.13 nm (=1485−1465.87) on the shorter wavelength side, and 19.34 nm (=1504.34−1485) on the longer wavelength size.

As shown in FIG. 2, this semiconductor laser module satisfies, at the central wavelength λFg (=1485 nm) of reflection of the FBG, the emission condition G×R=1 (wherein G is a power gain coefficient which represents net gain and R is a power absorption coefficient which represents mirror loss) which means that the mirror loss and the gain of the semiconductor device agree.

Therefore, in this semiconductor laser module, emission occurs in a manner that the central wavelength λLD(=1466 nm) of gain of the semiconductor laser device is pulled into the central wavelength λFg of reflection of the FBG.

If in FIG. 2, the central wavelength λLD of gain of the semiconductor laser device shifts beyond 1466 nm to the shorter wavelength side, the mirror loss curve CMR is no longer in contact with the spectral curve CGS of net gain at or near the central wavelength λFg of reflection of the FBG. In that case, no matter how current or carrier may be injected, the gain condition G×R=1 can not be satisfied at the central wavelength λFg(=1485 nm) of reflection of the FBG, and therefore, in the semiconductor laser module, the central wavelength λLD of gain of the semiconductor laser device is not pulled into the central wavelength λFg (=1485 nm) of reflection of the FBG.

In that case, emission by the semiconductor laser module occurs not in a FBG emission mode but in an ordinary Fabry-Perot (FP) emission mode. FIG. 4 relates to such a case, in which the emission wavelength of the semiconductor laser device is 1465 nm. In FIGS. 2 and 4, power ratio curves CR0 (spectral distributions of relative power) are also shown. It is to be noted that the power ratio curve CR0 does not have the same form as the emission spectrum since in the power ratio curve, power ratios at close wavelengths are not separated.

FIGS. 5 and 6 show spectral distributions of actual output power (mW) of semiconductor laser modules corresponding to FIGS. 2 and 4, respectively.

FIG. 5 shows that the semiconductor laser module corresponding to FIG. 2 has most of its output power at the central wavelength λFg (=1485 nm) of reflection of the FBG. The semiconductor laser module has some output power near the central wavelength λLD (=1466 nm) of gain of the semiconductor laser device, because the reflecting mirror loss curve is close to the gain spectrum at the wavelength λLD.

On the other hand, FIG. 6 shows that emission by the semiconductor laser module corresponding to FIG. 4 occurs around the central wavelength λLD (=1466 nm) of gain of the semiconductor laser device. The semiconductor laser module has also some output power near the central wavelength λFg (=1485 nm) of reflection of the FBG, because the reflecting mirror loss curve is close to the gain spectrum at the wavelength λFg.

FIG. 7 shows a mirror loss curve CMR, a net gain spectral curve CGS and a power ratio curve CR0 of a semiconductor laser module comprising a semiconductor laser device and a FBG in which the half width at half maximum of gain spectrum of the semiconductor laser device is 30 nm, a dielectric multilayer coating of, for example, $TiO_2$ and $SiO_2$ showing a reflectance of 1% at the central wavelength of reflection is formed on the emitting surface of the semiconductor laser device, the central wavelength λLD of gain of the semiconductor laser device is 1479 nm when the emission wavelength of the whole semiconductor laser module is 1460 nm, and the central wavelength λFg of reflection of the FBG is 1460 nm.

Here, a point PC where the mirror loss curve CMR is in contact with the net gain spectral curve CGS is at the central wavelength λFg (=1460 nm) of reflection of the FBG, and the central wavelength λFg is on the shorter wavelength side of the central wavelength λLD (=1479 nm) of gain of the semiconductor laser device. In this semiconductor laser module, the central wavelength λLD of gain of the semiconductor laser device is pulled into the central wavelength λFg of reflection of the FBG.

As is clear from FIG. 8 which shows a relationship between the central wavelength (nm) of gain of the semiconductor laser device and the emission wavelength (nm) of the whole module, when the central wavelength λLD of gain of the semiconductor laser device is within the range of ΔA(1440.63 nm) to ΔA(1479.38 nm), the emission wavelength of the whole semiconductor laser module is pulled into the central wavelength λFg (=1460 nm) of reflection of the FBG.

On the other hand, FIG. 9 shows that when the central wavelength λLD of gain of the semiconductor laser device shifts beyond 1479.38 nm to the longer wavelength side, emission by the semiconductor laser module occurs mainly in a FP emission mode, not in a FBG emission mode.

For example, when the emission wavelength of the semiconductor laser device is 1480 nm, the central wavelength λLD of gain thereof is 1480 nm. Therefore, the mirror loss curve CMR is not in contact with the net gain spectral curve CGS at or near the central wavelength λFg (=1460 nm) of reflection of the FBG. Therefore, the semiconductor laser module satisfies the gain condition G×R=1 not at the central wavelength λFg (=1460 nm) of reflection of the FBG but at the central wavelength λLD (=1480 nm) of gain of the semiconductor laser device, and therefore, the emission wavelength of the whole semiconductor laser module is not pulled into the central wavelength λFg (=1460 nm) of reflection of the FBG. FIGS. 10 and 11 show spectral distributions of actual output power (mW) of the semiconductor laser modules corresponding to FIGS. 7 and 9, respectively.

As is understood from FIGS. 2 to 11, in connection with increasing stability of emission wavelength, there is a very close relationship among the width of gain spectrum of the semiconductor laser device, a difference between the central wavelength λFg of reflection of the FBG and the central wavelength λLD of gain spectrum of the semiconductor laser device, and the pulling width at half maximum WHP.

When the semiconductor laser module comprising the semiconductor laser device and the optical feedback medium has the above described features, a large pulling width can be secured. Further, when the difference between the reflectance $R_{GL}$ of the diffraction grating at the central wavelength λFg of reflection and the reflectance $R_1$ of the first multilayer coating formed on the emitting surface satisfies a condition $R_{GL} - R_1 \geq -2\%$, emission by the semiconductor laser module occurs mainly in a FBG emission mode, so that the output power is more stabilized.

Further, when optical coupling means is provided between the emitting surface of the semiconductor laser device and the optical feedback medium (waveguide or fiber having the optical grating therein) to have the power coupling efficiency of 50% or higher, the pulling width is prevented from narrowing, so that the semiconductor laser module is maintained as the compound resonator type laser module. It is to be noted that even if various parameters relating to the semiconductor laser module can be held at fixed values, a drop in the power coupling efficiency directly affects the wavelength pulling property.

In order that the wavelength pulling property may not drop beyond its limit, the semiconductor laser module needs to have the power coupling efficiency of 50% or higher. For example, the semiconductor laser module for which the parameters are determined as shown in FIG. 1 shows the optical coupling efficiency of 75%. If the power coupling efficiency is 100%, the pulling width at half maximum WHP is about 21.6 nm, and if the power coupling efficiency is 50%, the pulling width at half maximum $W_{HP}$ is about 16.6 nm. The difference is so large as about 5 nm.

In an ordinary pump laser for exciting an EDFA, output power is very important. It is said that in order to meet demands in various communication systems, an ordinary pump laser for exciting an EDFA needs to have output power of about 120 mW.

On the other hand, a laser device to be used in an ordinary semiconductor laser has a limit of output power. Further, a pump laser having a FBG has higher wavelength stability, but due to the attached FBG, a certain drop in output power as compared with a pump laser not having a FBG is inevitable. In order that a pump laser having a FBG may have the output power of 120 mW or higher, it is desirable that the power coupling efficiency is 50% or higher, provided that parameters for the pump laser are so determined that the pump laser can be manufactured easily.

BRIEF DESCRIPTION OF THE DRAWINGS

FIGS. 18A to 18D show spectra of fiber output (dBm) of a semiconductor laser module of a second embodiment under operating temperatures of 5, 15, 25 and 35° C., respectively; and FIGS. 19A to 19C show spectra of fiber output (dBm) of a semiconductor laser module of a second embodiment under operating temperatures of 45, 55, and 65° C., respectively;

BEST MODE OF CARRYING OUT THE INVENTION

Embodiments of the present invention will be described based on FIGS. 12 to 19.

Embodiment 1

Figure 1:
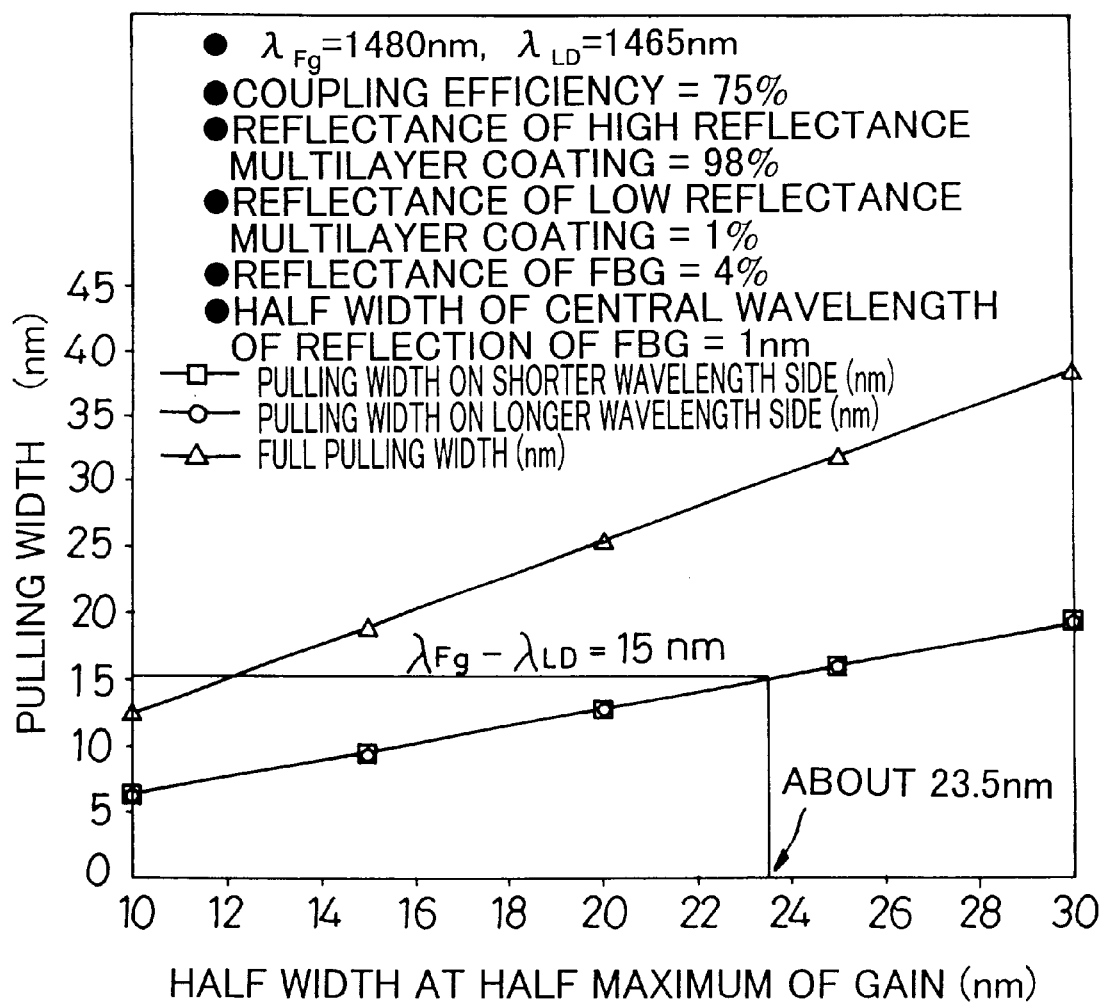
FIG. 1 is a characteristic diagram showing a relationship between half width at half maximum of gain of a semiconductor laser device and pulling width, which is provided for explaining the pulling width in a semiconductor laser module according to the present invention.
Figure 2:
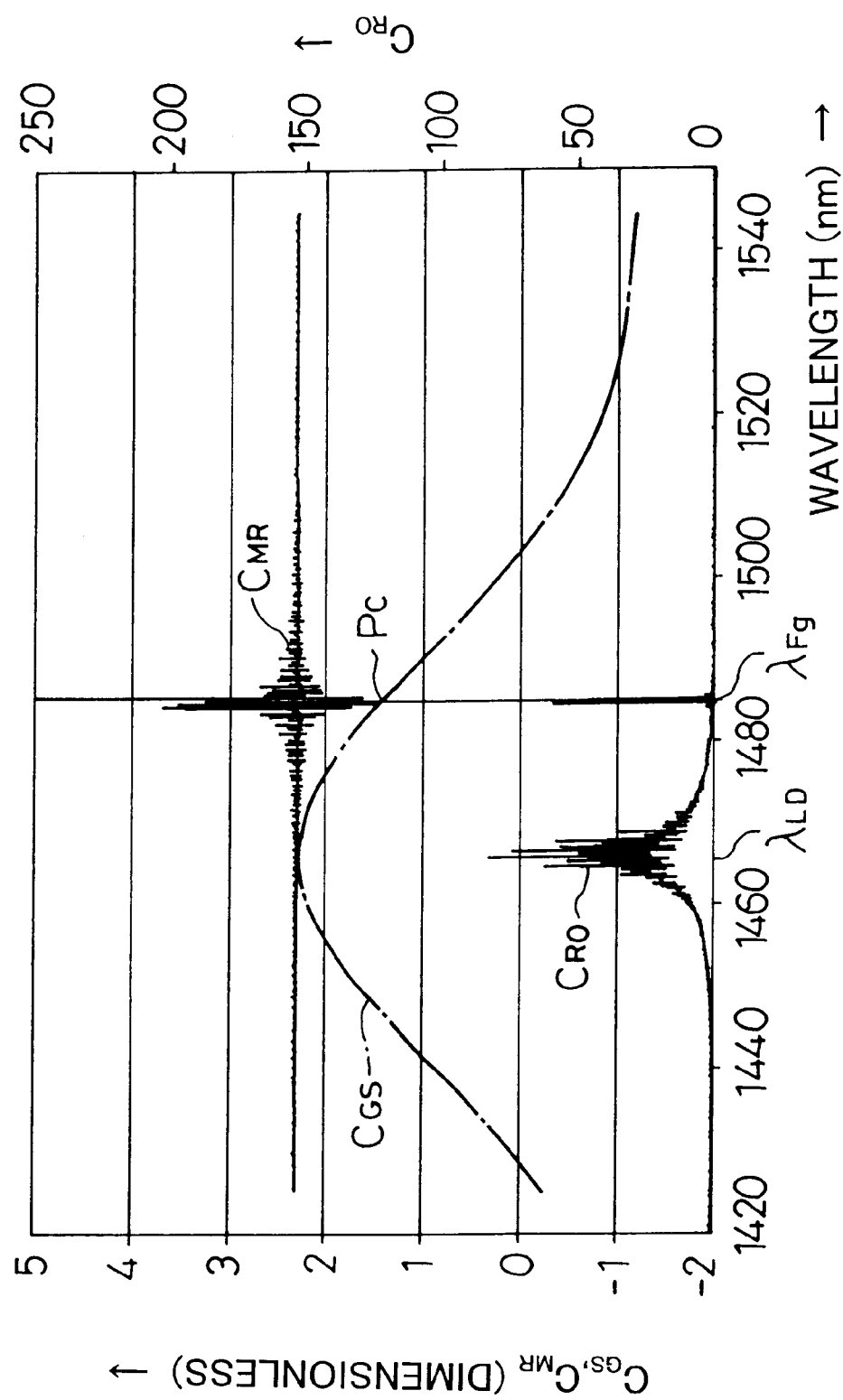
FIG. 2 is a spectral characteristic diagram showing a relationship among mirror loss, gain, power ratio, a central wavelength λFg of reflection of an optical feedback medium, and a central wavelength λLD of gain of a semiconductor laser device in a semiconductor laser module according to the present invention, wherein emission occurs in a manner that the central wavelength of gain of the semiconductor laser device is pulled into the central wavelength of reflection of a fiber bragg grating.
Figure 3:
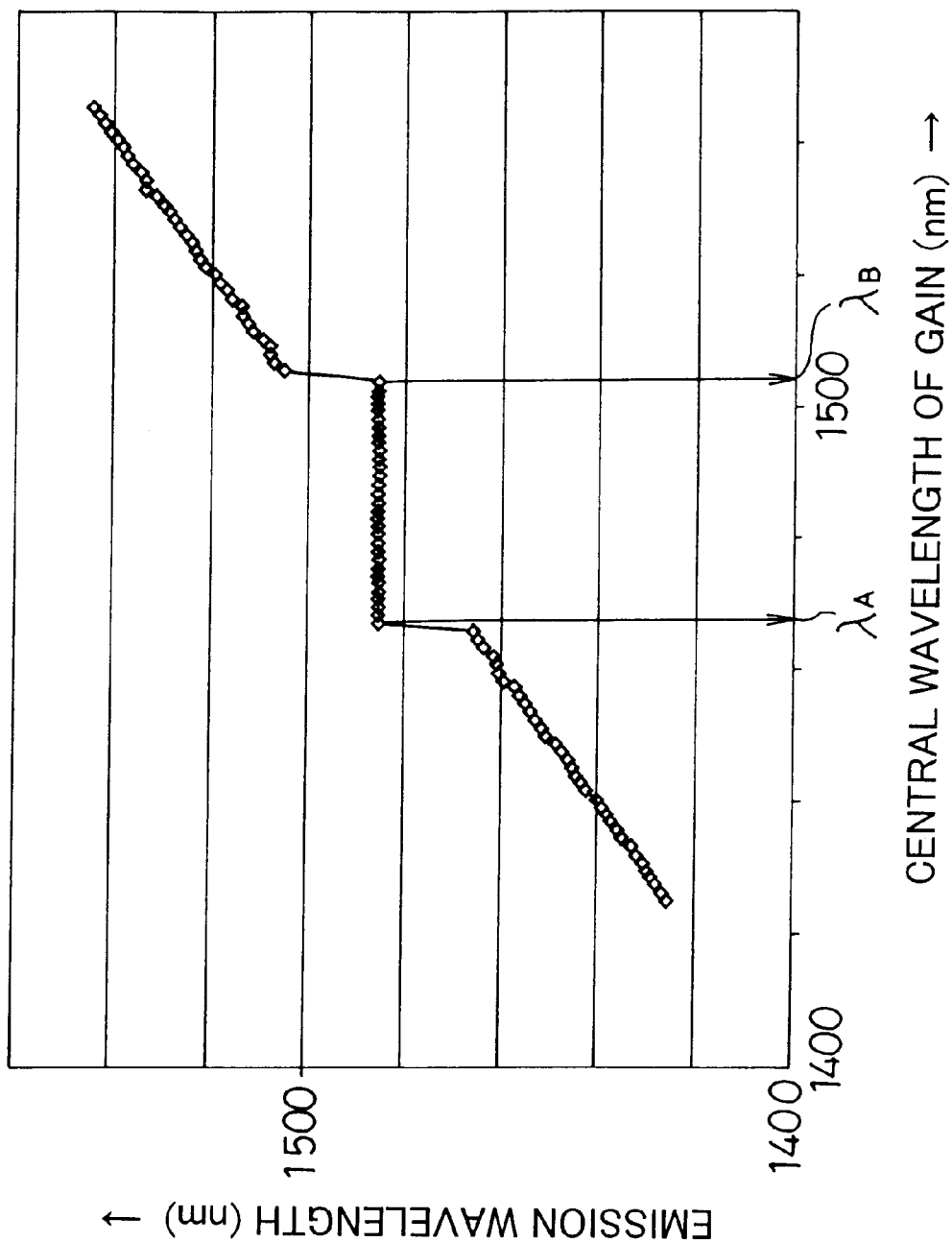
FIG. 3 is a characteristic diagram relating to a semiconductor laser module corresponding to FIG. 2, and showing a relationship between central wavelength of gain of a semiconductor laser device and emission wavelength of the semiconductor laser module.
Figure 4:
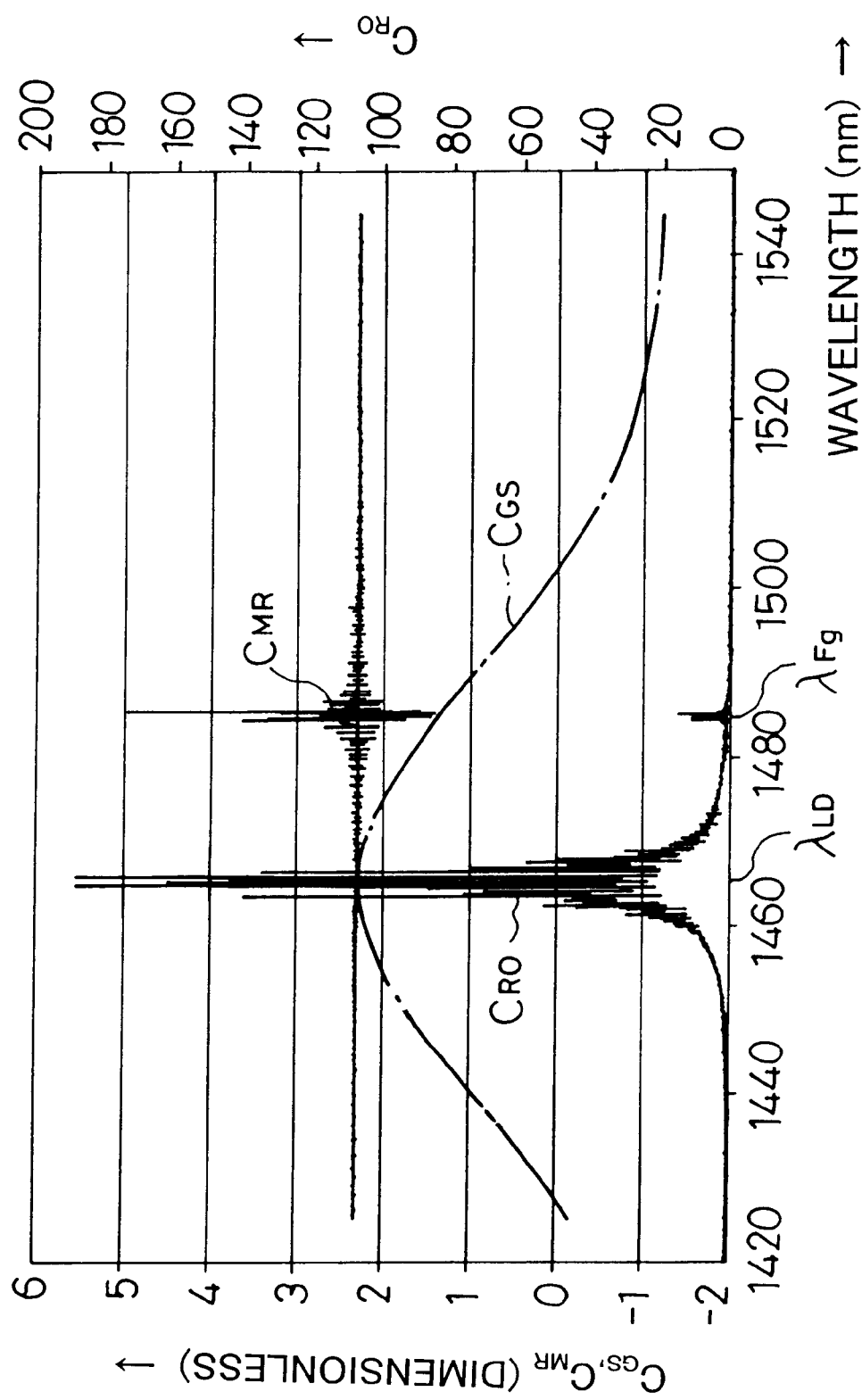
FIG. 4 is a spectral characteristic diagram showing a relationship among mirror loss, gain, power ratio, a central wavelength λFg of reflection of an optical feedback medium, and a central wavelength λLD of gain of a semiconductor laser device in a semiconductor laser module according to the present invention, wherein the central wavelength of gain of the semiconductor laser device is not pulled into the central wavelength of reflection of a fiber bragg grating.
Figure 5:
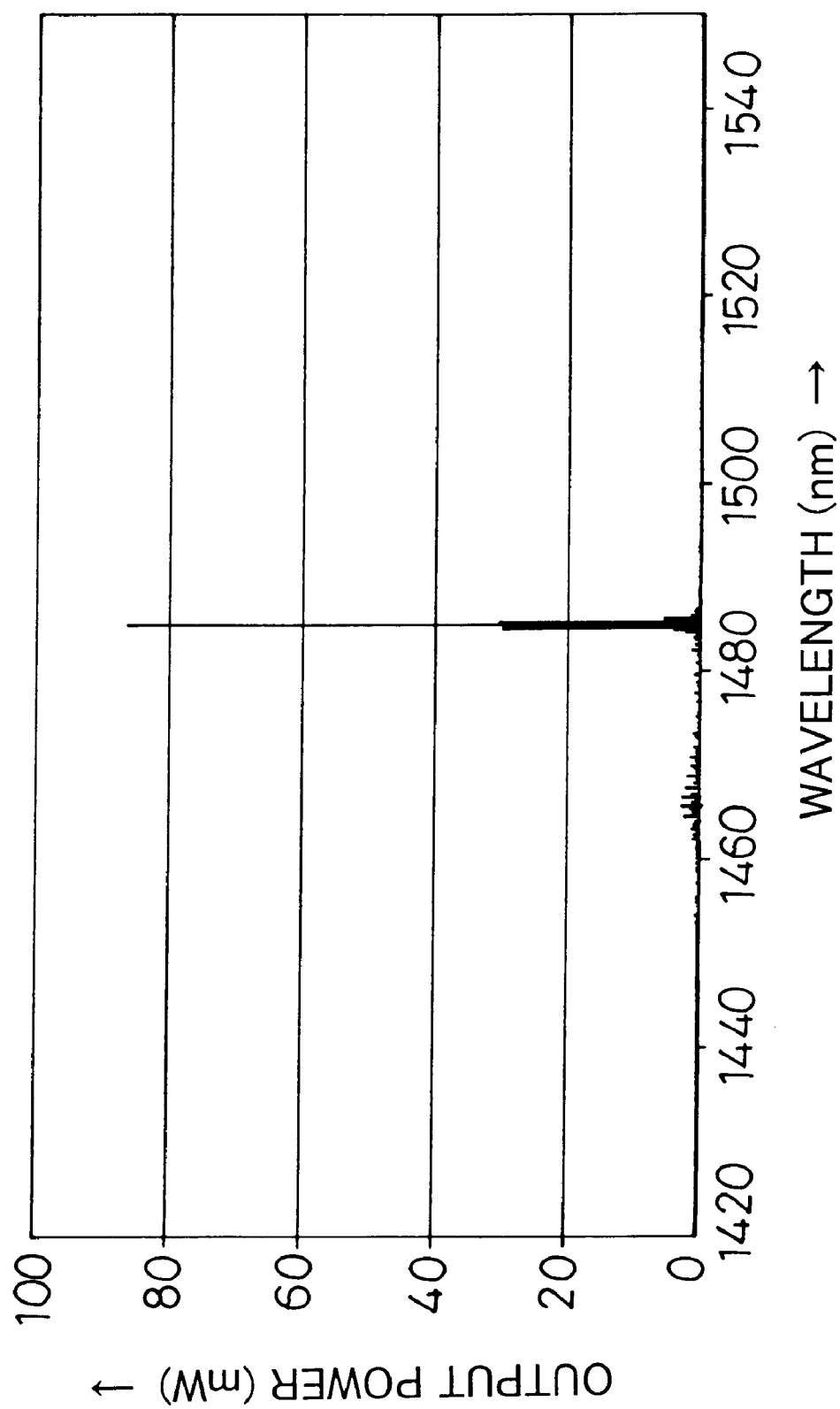
FIG. 5 is a spectral distribution diagram of actual output power of a semiconductor laser module corresponding to FIG. 2.
Figure 6:
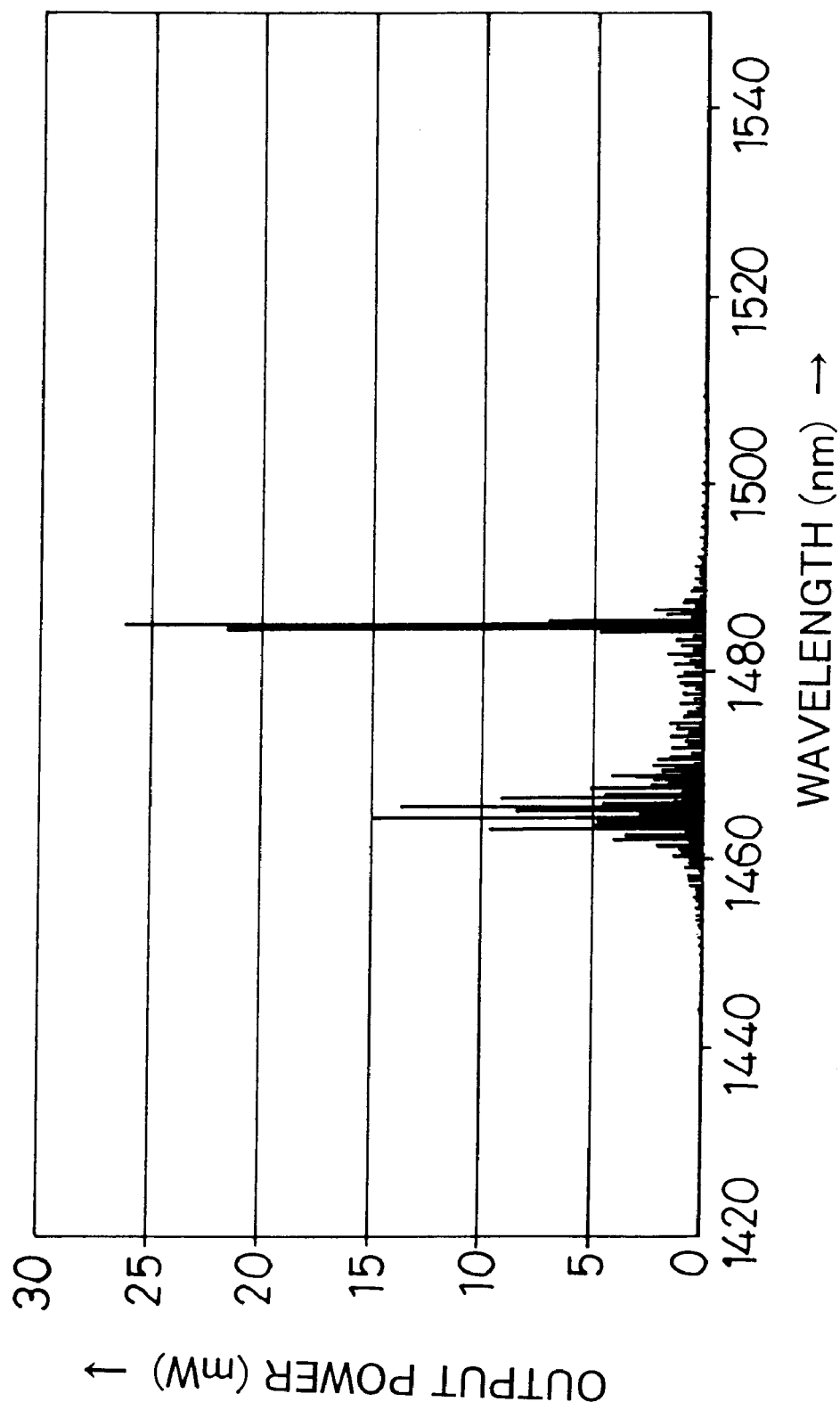
FIG. 6 is a spectral distribution diagram of actual output power of a semiconductor laser module corresponding to FIG. 4.
Figure 7:
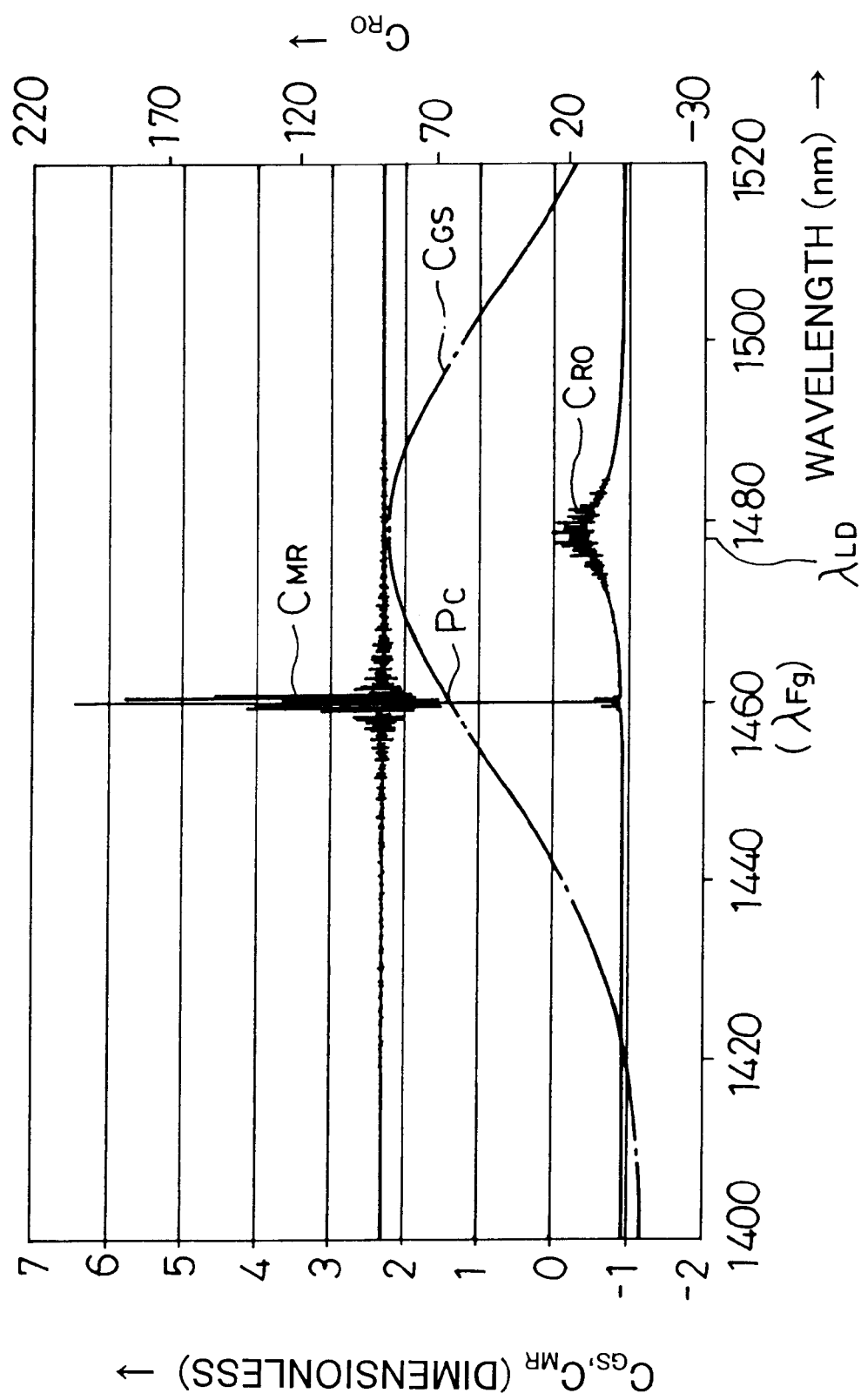
FIG. 7 is a spectral characteristic diagram showing a relationship among mirror loss, gain, power ratio, a central wavelength λFg of reflection of an optical feedback medium, and a central wavelength λLD of gain of a semiconductor laser device in another semiconductor laser module according to the present invention, wherein emission occurs in a manner that the central wavelength of gain of the semiconductor laser device is pulled into the central wavelength of reflection of a fiber bragg grating.
Figure 8:
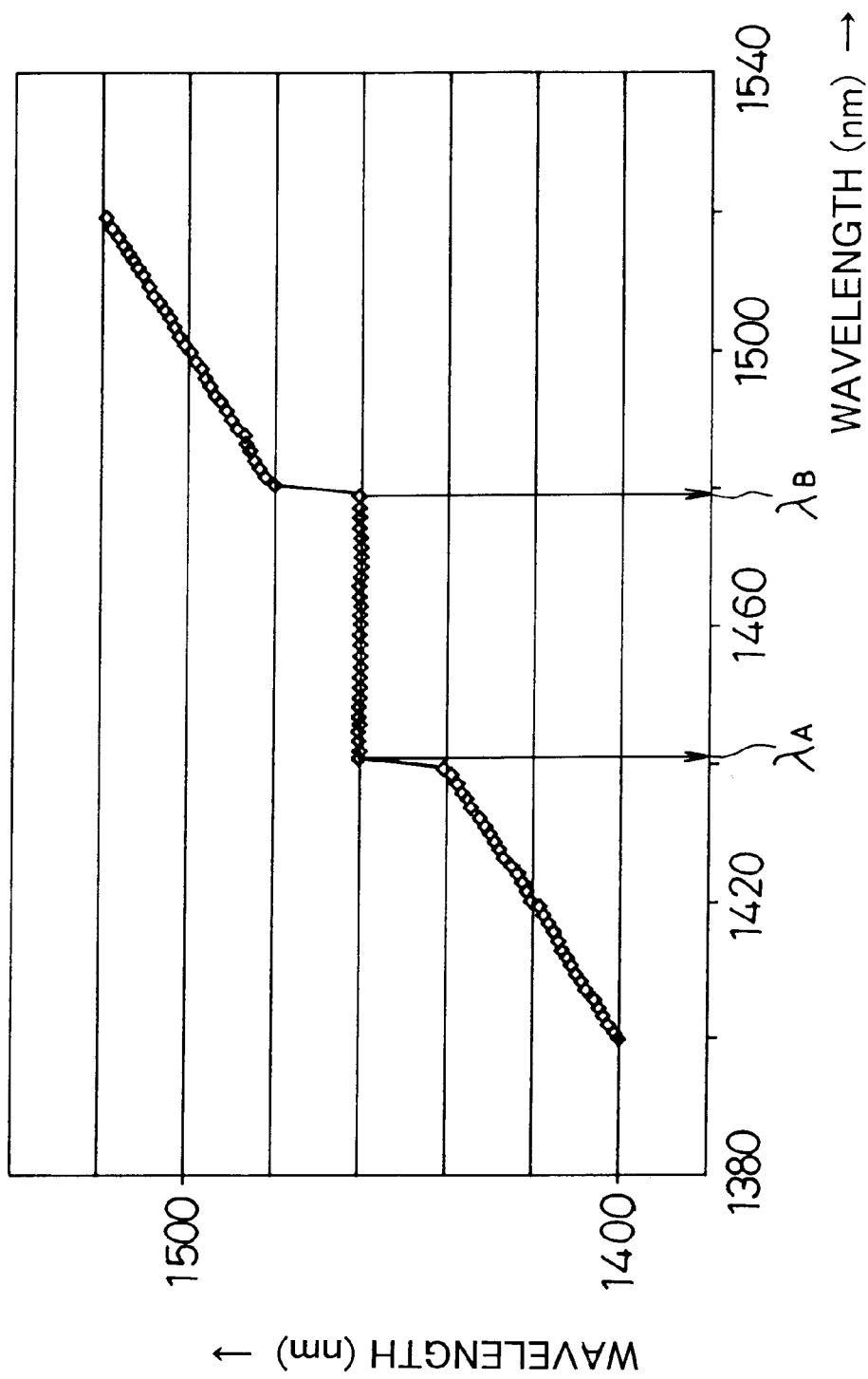
FIG. 8 is a characteristic diagram relating to a semiconductor laser module corresponding to FIG. 7, and showing a relationship between central wavelength of gain of a semiconductor laser device and emission wavelength of the semiconductor laser module.
Figure 9:
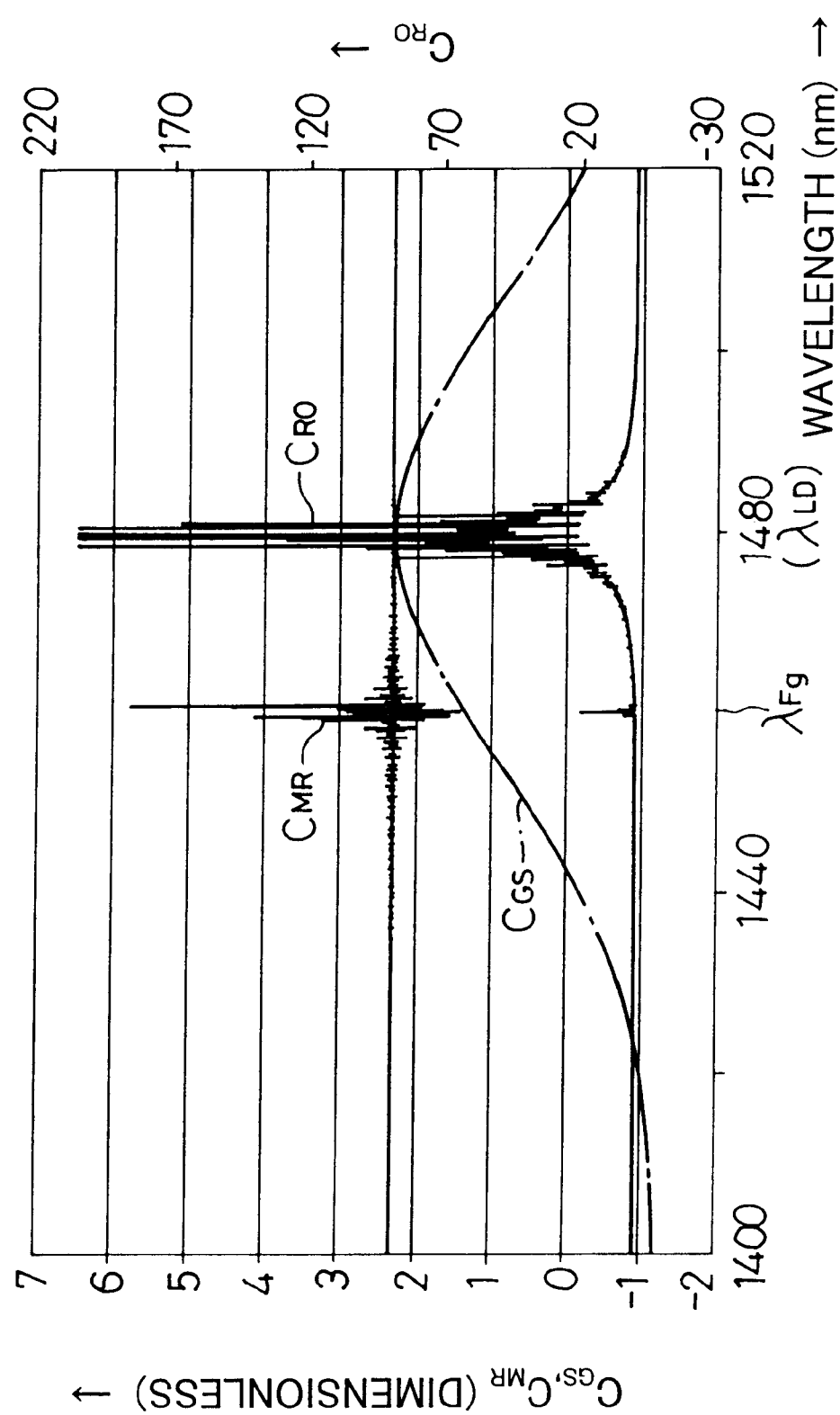
FIG. 9 is a spectral characteristic diagram showing a relationship among mirror loss, gain, power ratio, a central wavelength λFg of reflection of an optical feedback medium, and a central wavelength λLD of gain of a semiconductor laser device in another semiconductor laser module according to the present invention, wherein the central wavelength of gain of the semiconductor laser device is not pulled into the central wavelength of reflection of a fiber bragg grating.
Figure 10:
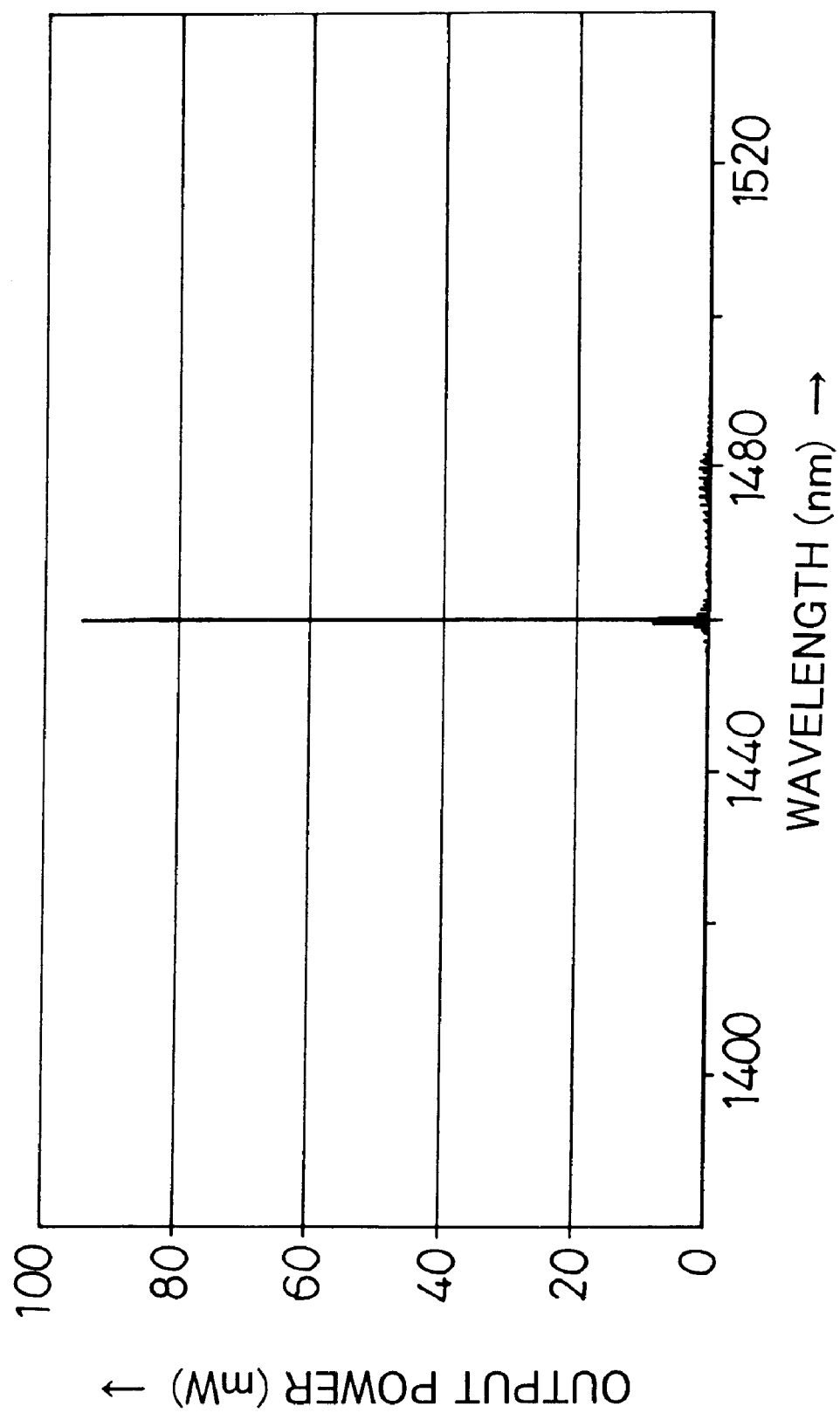
FIG. 10 is a spectral distribution diagram of actual output power of a semiconductor laser module corresponding to FIG. 7.
Figure 11:
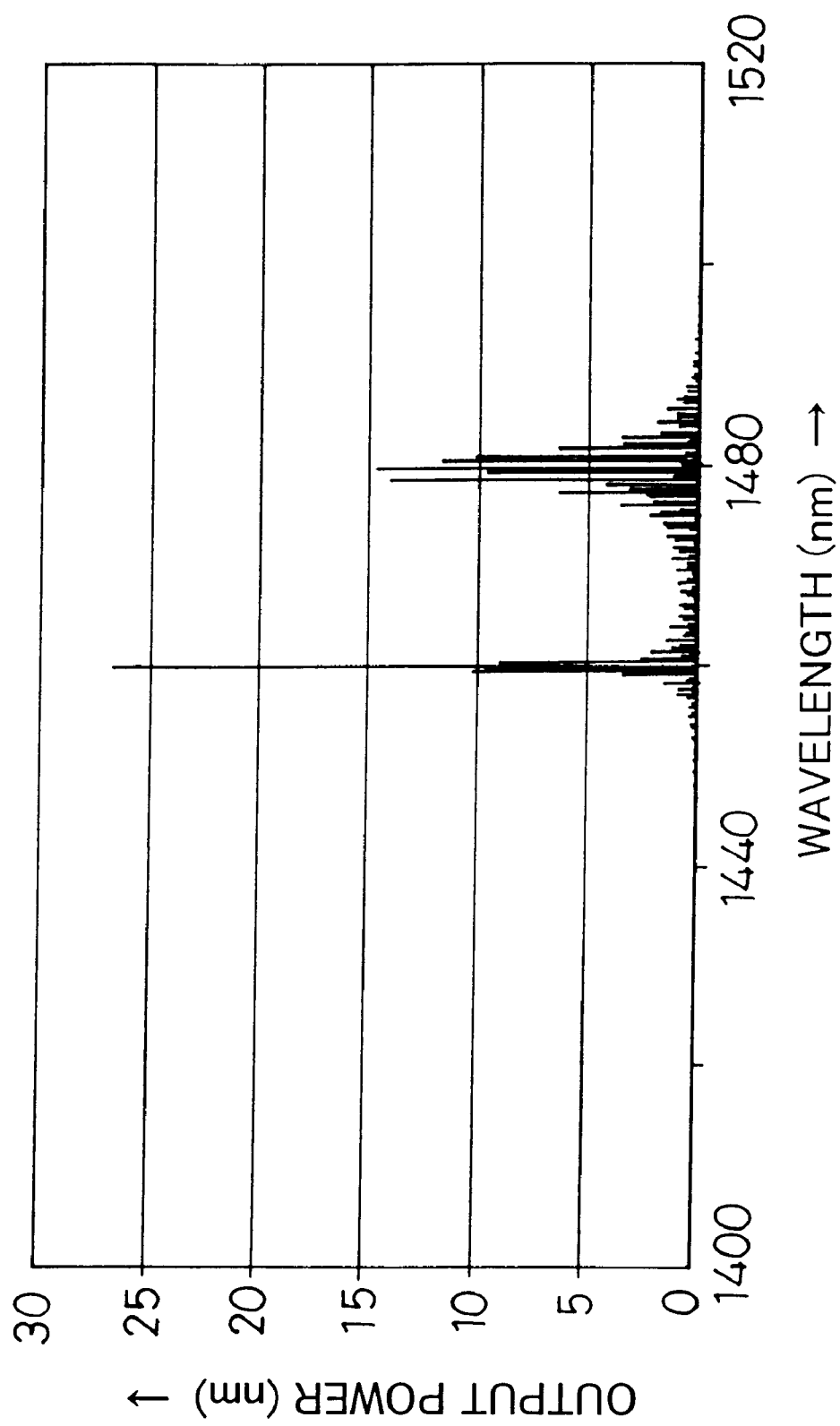
FIG. 11 is a spectral distribution diagram of actual output power of a semiconductor laser module corresponding to FIG. 9.
Figure 12:
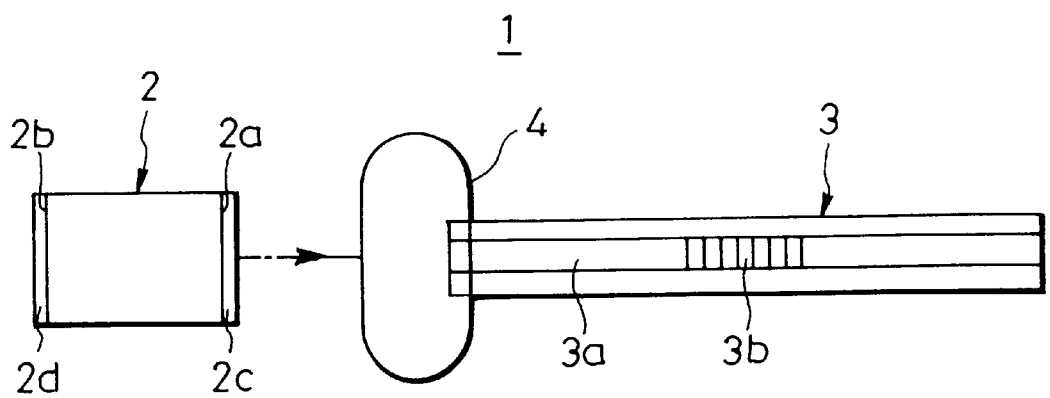
FIG. 12 is an illustration showing schematic structure of a semiconductor laser module according to the present invention.

As shown in FIG. 12, a semiconductor laser module (hereinafter referred to simply as "module") 1 comprises a semiconductor laser device 2, an FBG 3 which is arranged to face the semiconductor laser device 2 leaving a predetermined space therebetween, and optical coupling means 4 arranged between the laser device 2 and the FBG 3.

The semiconductor laser device 2 has an emitting surface 2a from which exited light is emitted, and a reflecting surface 2b which is opposite to the emitting surface 2a. On the emitting surface 2a of the semiconductor laser device 2 is formed a low reflectance multilayer coating 2c having a reflectance of 1%. On the reflecting surface 2b thereof is formed a high reflectance multilayer coating 2d having a reflectance of 98%.

Figure 13:
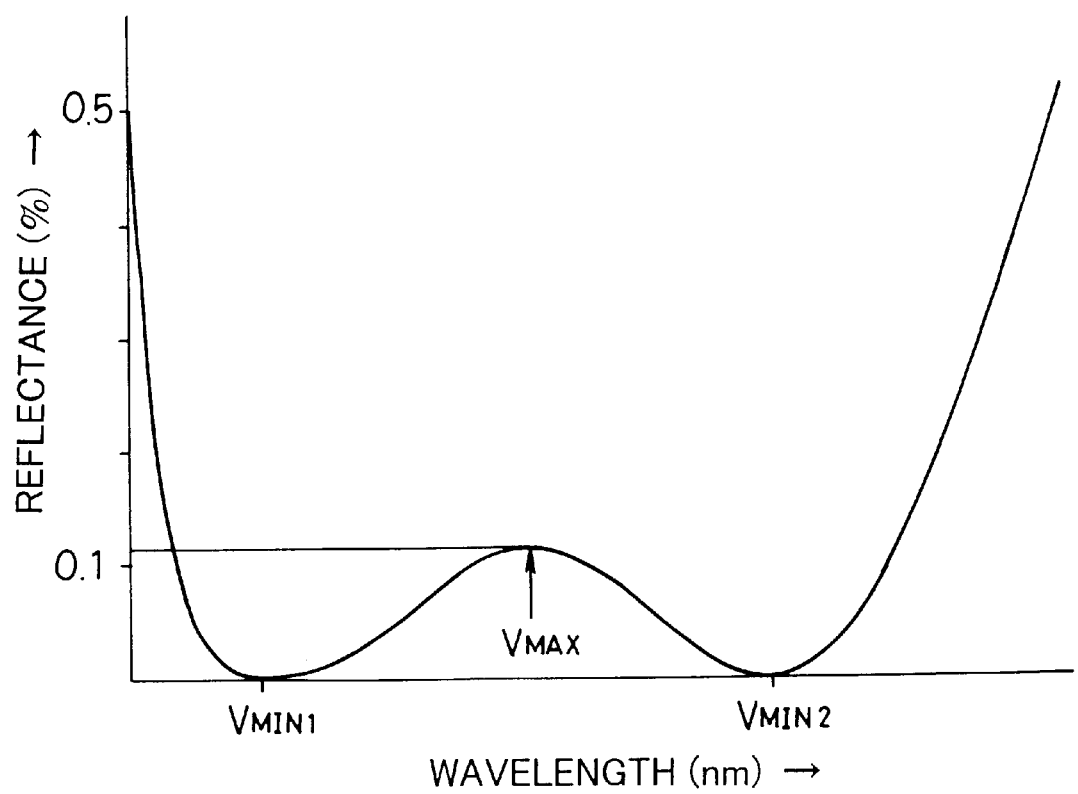
FIG. 13 is a diagram showing a reflection spectrum of a first multilayer coating formed on an emitting surface of a semiconductor laser device included in the semiconductor laser module shown in FIG. 12.
Figure 14:
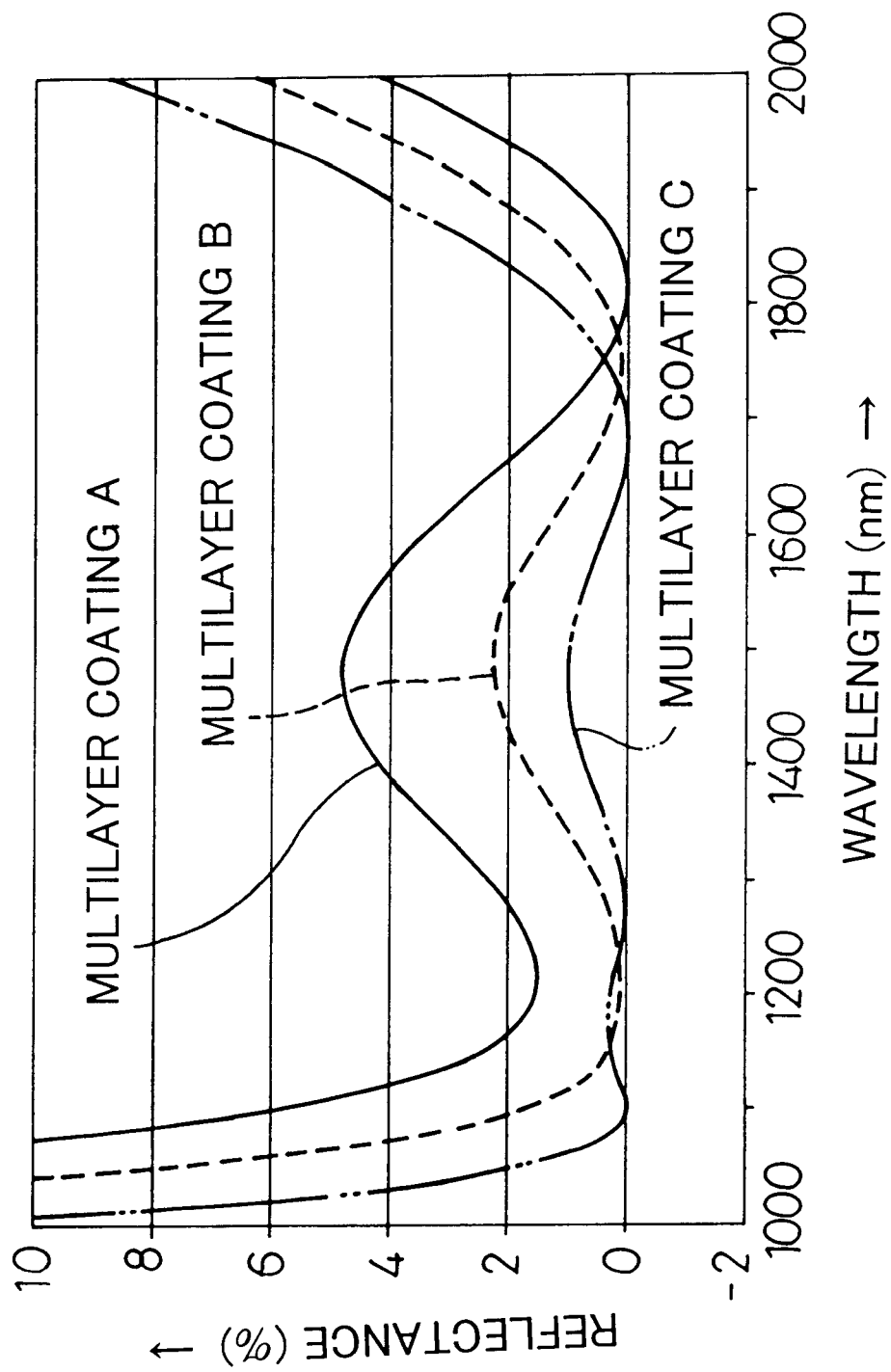
FIG. 14 is a diagram showing reflection spectra of three kinds of first multilayer coatings, each of which is a dielectric multilayer coating and shows wavelength dependency.

The low reflectance multilayer coating 2c is formed of dielectric materials such as $TiO_2$ and $SiO_2$. As shown in FIG. 13, the low reflectance multilayer coating 2c has a reflection spectrum in the form of a curve having minimum values VMIN1 and VMIN2 on both sides of the central wavelength $\lambda C$ at which the reflectance takes a maximum value. The low reflectance multilayer coating 2c is formed, for example, by depositing, on the front surface of the semiconductor laser device 2, thin layers of $TiO_2$ and $SiO_2$ alternately in this order to have a six-layer structure. By varying the optical thickness of each layer (details such as composition, optical thickness and the like are shown in tables 1 to 3), three kinds of multilayer coatings A to C having spectral distributions of reflectance as shown in FIG. 14 are formed.

TABLE 1

| Multilayer coating A | | Optical thickness (nm) | Refractive index |
|---|---|---|---|
| Number of layers | 6 | 360 | 2.3 |
| | | 270 | 1.52 |
| | | 180 | 2.3 |
| | | 180 | 1.52 |
| | | 270 | 2.3 |
| | | 360 | 1.52 |
| Refractive index of base | | 3.4 | |
| Refractive index of medium | | 1 | |
| Start wavelength (nm) | | 1000 | |
| End wavelength (nm) | | 2000 | |
| Central wavelength (nm) | | 1440 | |
| Number of beams | | 1 | |
| Incident angle (deg) | | 0 | |

TABLE 2

| Multilayer coating B | | Optical thickness (nm) | Refractive index |
|---|---|---|---|
| Number of layers | 6 | 365 | 2.3 |
| | | 273.75 | 1.52 |
| | | 146 | 2.3 |
| | | 182.5 | 1.52 |
| | | 0.75 | 2.3 |
| | | 365 | 1.52 |
| Refractive index of base | | 3.4 | |
| Refractive index of medium | | 1 | |
| Start wavelength (nm) | | 1000 | |
| End wavelength (nm) | | 2000 | |
| Central wavelength (nm) | | 1460 | |
| Number of beams | | 1 | |
| Incident angle (deg) | | 0 | |

TABLE 3

| Multilayer coating C | | Optical thickness (nm) | Refractive index |
|---|---|---|---|
| Number of layers | 6 | 365 | 2.3 |
| | | 273.75 | 1.52 |
| | | 0.425 | 2.3 |
| | | 146 | 1.52 |
| | | 273.75 | 2.3 |
| | | 365 | 1.52 |
| Refractive index of base | | 3.4 | |
| Refractive index of medium | | 1 | |
| Start wavelength (nm) | | 1000 | |
| End wavelength (nm) | | 2000 | |
| Central wavelength (nm) | | 1460 | |
| Number of beams | | 1 | |
| Incident angle (deg) | | 0 | |

Figure 15:
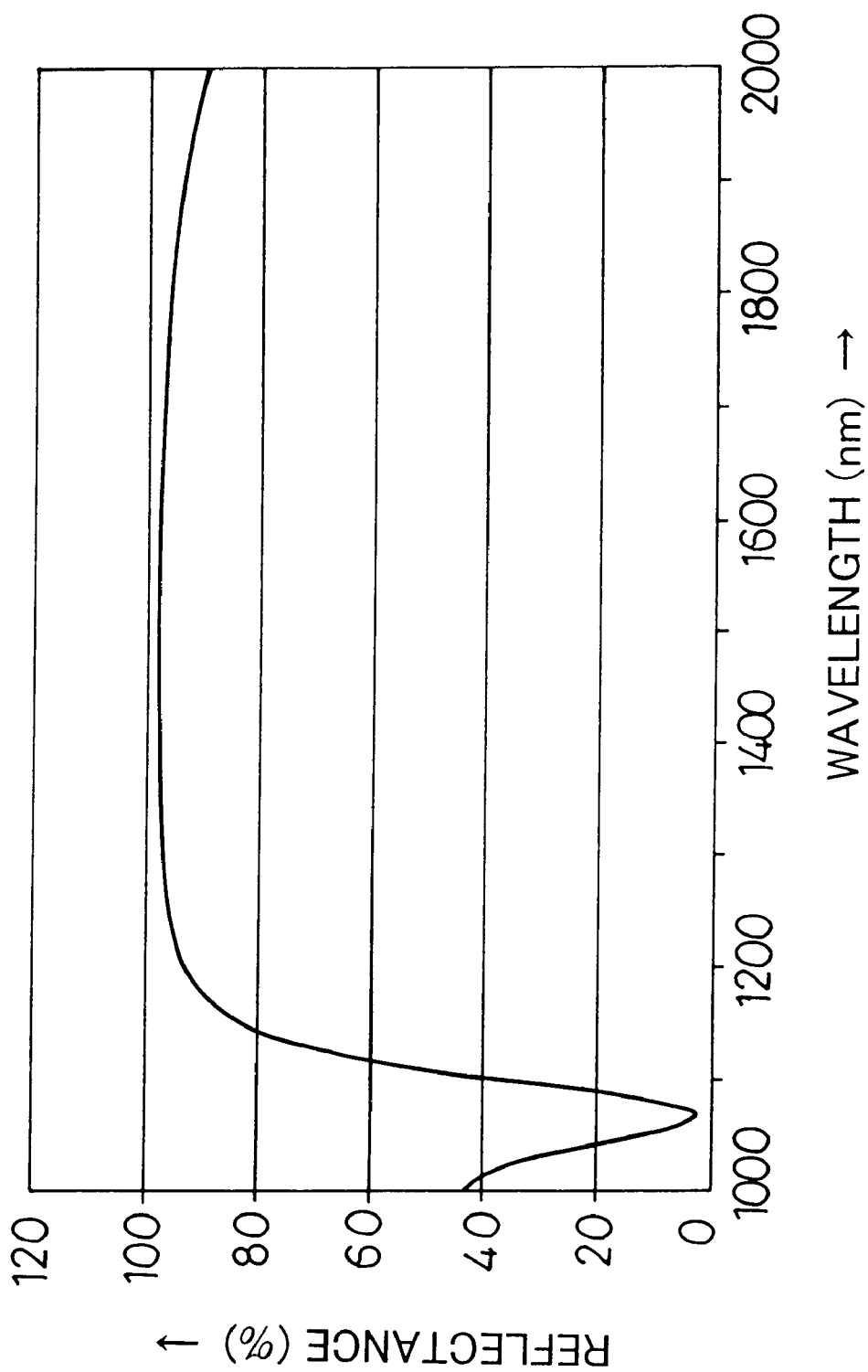
FIG. 15 is a diagram showing a reflection spectrum of a second multilayer coating formed on a reflecting surface of a semiconductor laser device included in the semiconductor laser module shown in FIG. 12.
Figure 16A:
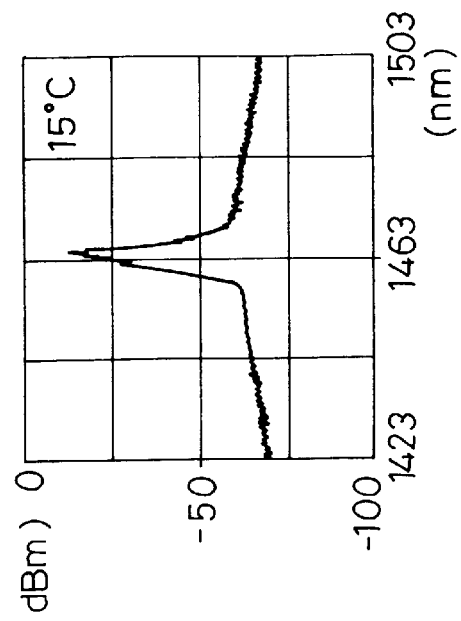
FIGS. 16A to 16D show spectra of fiber output (dBm) of a semiconductor laser module of a first embodiment under operating temperatures of 5, 15, 25 and 35° C., respectively.
Figure 16B:
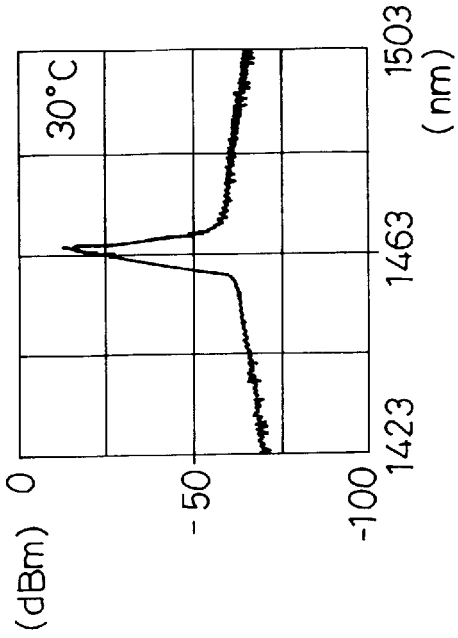
Figure 16C:
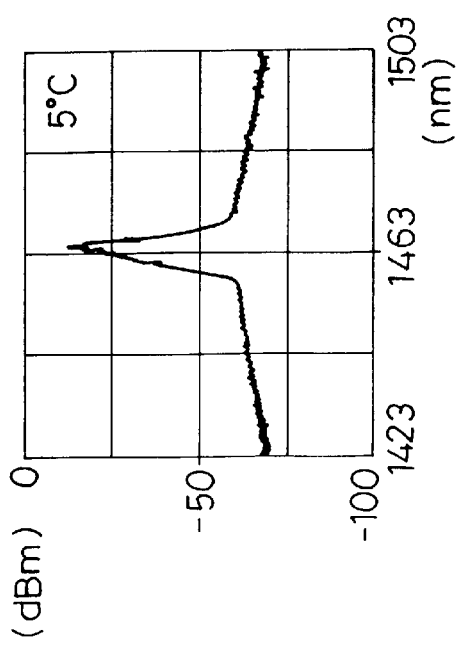
Figure 16D:
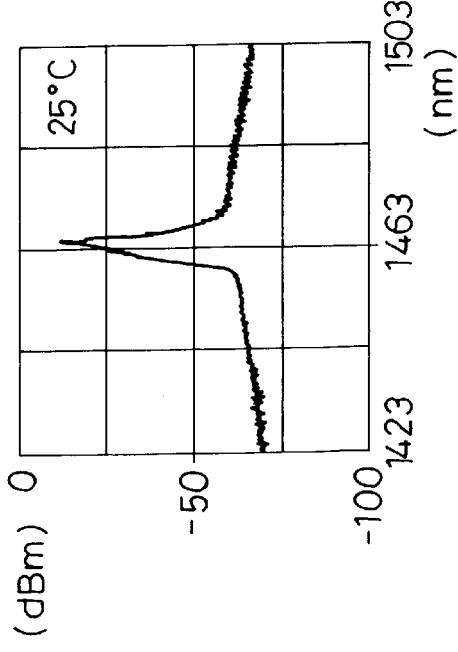

The high reflectance multilayer coating 2d is formed of dielectric materials such as $SiO_2$ and amorphous silicon ($\alpha$-Si) to have seven layers in the order of $SiO_2/\alpha$-Si/ . . . /$SiO_2$. Each layer has an optical thickness of $\lambda/4$ ($\lambda=1480$ nm). As shown in FIG. 15, the high reflectance multilayer coating 2d has an almost flat reflection spectrum and does not show wavelength selectivity in the wavelength range of 1400 to 1600 nm.

The semiconductor laser device 2 has a multimode emission spectrum, and is arranged such that a difference between the central wavelength $\lambda LD$ of gain spectrum of the semiconductor laser device 2 and the central wavelength $\lambda Fg$ of reflection of the FBG 3 is ±20 nm or less, and the half width at half maximum of gain spectrum of the semiconductor laser device 2 is 10 nm or more.

The FBG 3 is an optical feedback medium for feeding the optical power emitted from the emitting surface 2a of the semiconductor laser device 2 back to the semiconductor laser device based on a predetermined coupling efficiency and for emitting the optical power. A grating 3b is formed in a core 3a of an optical fiber by varying a refractive index along the optical axis thereof. The grating 3b is arranged such that the reflectance at the central wavelength $\lambda Fg$ of reflection is 4%.

The optical coupling means 4 is formed using any of a conventional two-lens confocal compound lens system, a rounded fiber, and a wedge-lensed fiber and the like.

In a semiconductor laser module 1 having the above described structure, a semiconductor laser device 2 was arranged to face a FBG 3 leaving a space of 12 mm therebetween. Here, data on the used semiconductor laser device 2 was as follows: The device length was 800 $\mu$m, the refractive index n of a waveguide was 3.4, the absorption coefficient was 15(cm$^{-1}$), the width of an active layer was 2.5 μm, the thickness of the active layer was 20 nm, and the confinement coefficient of the active layer was 2.5×10$^{-2}$. Bias current of 500 mA was injected to the semiconductor laser device 2 of the semiconductor laser module 1, and the fiber output (dBm) was measured at every 10° C. of the operating temperature which was varied in the range of 5 to 65° C.

Data on the FBG 3 was as follows: The coupling efficiency of the FBG 3 and the semiconductor laser device 2 was 75%, the refractive index of a core 3a is 1.54, the transmission loss was 0.2 (dB/km), the distance between the end face of the FBG 3 and a grating 3b was 10 cm, the length of the grating 3b was 1.0 cm, the central wavelength λFg of reflection was 1463 nm, the half width at half maximum of reflection spectrum was 4.0 nm, and the reflectance at the central wavelength λFg was 4%.

Data on the semiconductor laser module 1 was as follows: the effective recombination coefficient was about 1.5×10$^{-10}$ (cm$^3$/sec.), the Auger effect recombination coefficient was about 7.5×10$^{-29}$ (cm$^6$/sec.), spontaneous carrier emission duration was about 1.3 (nsec.), the differential gain was about 3.5×10$^{-16}$ (cm$^2$), the transparent carrier density was about 1.0×10$^{18}$ (cm$^{-3}$), the gain bandwidth was 30 (nm), the central wavelength λLD of gain at the temperature of 25° C. was 1472 nm, the internal quantum efficiency relating to the injected bias current was 0.95.

Figure 17A:
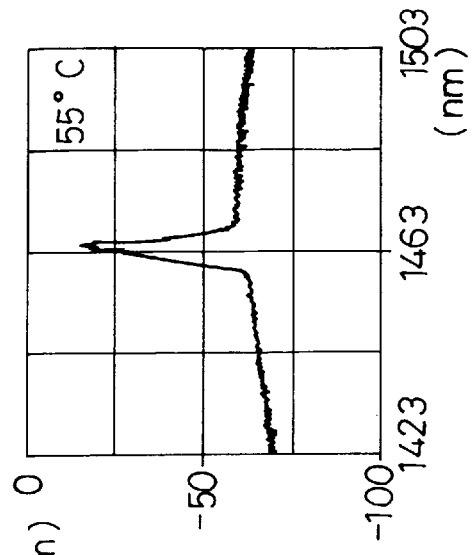
FIGS. 17A to 17C show spectra of fiber output (dBm) of a semiconductor laser module of a first embodiment under operating temperatures of 45, 55, and 65° C., respectively.
Figure 17B:
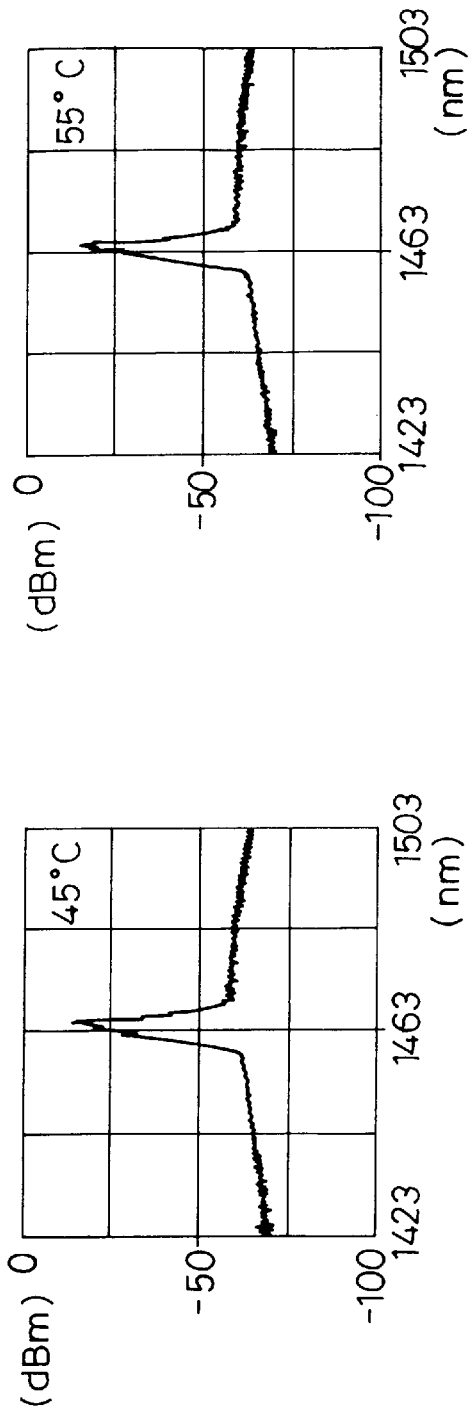
Figure 17C:
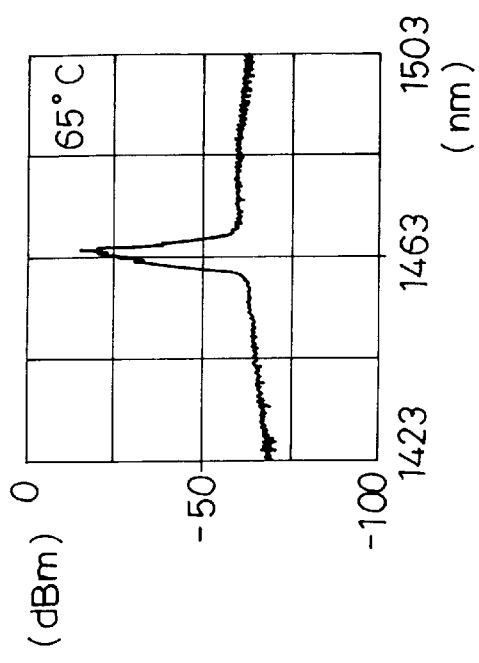

The result of measurement performed under the above conditions are shown in FIGS. 16A to 17C. FIGS. 16A to 16D show spectral distributions of fiber output (dBm) at the temperatures of 5, 15, 25 and 35° C., respectively, and FIGS. 17A to 17C show spectral distributions of fiber output (dBm) at the temperatures of 45, 55 and 65° C., respectively. It is to be noted that the shown output power is lower than the real output power of the laser, because the shown output power includes loss due to an output power spectral value measuring instrument inserted in the laser.

As is clear from FIGS. 16A to 17C, the semiconductor laser module 1 has an output power spectrum which does not depend on temperature, shows emission wavelength stability under the change of temperature, and has output power high enough to serve as a light source for exciting an EDFA.

Embodiment 2

In the semiconductor laser module 1 of embodiment 1, the condition relating to the reflectance of the FBG was changed from 4% to 1%. Bias current of 500 mA was injected to the semiconductor laser device 2, and the fiber output power (dBm) was measured at every 10° C. of the operating temperature which was varied in the range of 5 to 65° C.

The result of measurement of the fiber output are shown in FIGS. 18A to 19C. FIGS. 18A to 18D show spectral distributions of fiber output (dBm) at the temperatures of 5, 15, 25 and 35° C., respectively, and FIGS. 19A to 19C show spectral distributions of fiber output (dBm) at the temperatures of 45, 55 and 65° C., respectively.

As is clear from FIGS. 18A to 19C, even when the measurement condition was changed as described above, it was found that the semiconductor laser module 1 had an output power spectrum which did not depend on temperature, showed emission wavelength stability under the change of temperature, and had output power high enough to serve as a light source for exciting an EDFA.

In the present specification, two embodiments have been described. However, as is understood from the above description, numerous embodiments can be made by appropriately changing conditions such as spectral properties of the multilayer coating on the front surface of the semiconductor laser device, the full width of the central wavelength of reflection of the FBG, the reflectance at the central wavelength of reflection of the FBG, the length of the semiconductor laser device or the like.

INDUSTRIAL APPLICABILITY

A first aspect of the present invention can provide a semiconductor laser module which has high power, shows high stability of emission wavelength under change of temperature, and is suited to be a light source for exciting an EDFA With second to fifth aspects of the present invention, change in emission wavelength of the semiconductor laser module can be restrained, even if mode hop happens. Thus, the semiconductor laser module whose output power is high and changes very little and which shows higher stability of emission wavelength under change of temperature and is suited to be a light source for exciting an EDFA can be obtained.

With sixth and seventh aspects of the present invention, the semiconductor laser module showing higher stability of emission wavelength can be obtained.

With eighth and ninth aspects of the present invention, the semiconductor laser module which operates mainly in a FBG emission mode and therefore shows higher stability of output power can be obtained.

What is claimed is:

1. A semiconductor laser module comprising:
   a semiconductor laser device having an emitting surface from which excited light is emitted and a reflecting surface opposite to said emitting surface, and
   an optical feedback medium for feeding optical power emitted from said emitting surface of said semiconductor laser device back to said semiconductor laser device based on a predetermined coupling efficiency and emitting part of said optical power,
   wherein said semiconductor laser device has at least a first multilayer coating formed on said emitting surface and having a reflectance of 10$^{-4}$ to 10% at a central wavelength of reflection, and
   wherein said first multilayer coating has a reflection spectrum in the form of a curve having minimum values on both sides of the central wavelength of reflection, and said first multilayer coating has a wavelength characteristic that broadens a pulling width of said semiconductor laser device.

2. A semiconductor laser module according to claim 1, wherein said first multilayer coating has a reflection spectrum which has a maximum value near the central wavelength of reflection.

3. A semiconductor laser module according to claim 2, wherein said optical feedback medium is an optical waveguide or an optical fiber which has a core, a diffraction grating is formed in said core along an optical axis of said core, and said optical feedback medium is arranged to face said semiconductor laser device leaving a space of at least 10 mm as measured from said diffraction grating to said emitting surface of the semiconductor laser device.

4. A semiconductor laser module according to claim 3, wherein said semiconductor laser device has a second multilayer coating formed on said reflecting surface, and said second multilayer coating does not have wavelength selectivity and has a reflectance of 90 to 98%.

5. A semiconductor laser module according to claim 2, wherein said semiconductor laser device has a second multilayer coating formed on said reflecting surface, and said second multilayer coating does not have wavelength selectivity and has a reflectance of 90 to 98%.

6. A semiconductor laser module according to claim 2, wherein said semiconductor laser device has a multimode emission spectrum.

7. A semiconductor laser module according to claim 6, wherein the difference between a central wavelength of gain spectrum of said semiconductor laser device and a central wavelength of reflection of said diffraction grating is ±20 nm or less.

8. A semiconductor laser module according to claim 1, wherein said optical feedback medium is an optical waveguide or an optical fiber which has a core, a diffraction grating is formed in said core along an optical axis of said core, and said optical feedback medium is arranged to face said semiconductor laser device leaving a space of at least 10 mm as measured from said diffraction grating to said emitting surface of the semiconductor laser device.

9. A semiconductor laser module according to claim 8, wherein said semiconductor laser device has a second multilayer coating formed on said reflecting surface, and said second multilayer coating does not have wavelength selectivity and has a reflectance of 90 to 98%.

10. A semiconductor laser module according to claim 8, wherein said semiconductor laser device has a multimode emission spectrum.

11. A semiconductor laser module according to claim 10, wherein the difference between a central wavelength of gain spectrum of said semiconductor laser device and a central wavelength of reflection of said diffraction grating is ±20 nm or less.

12. A semiconductor laser module according to claim 1, wherein said semiconductor laser device has a second multilayer coating formed on said reflecting surface, and said second multilayer coating does not have wavelength selectivity and has a reflectance of 90 to 98%.

13. A semiconductor laser module according to claim 12, wherein said semiconductor laser device has a multimode emission spectrum.

14. A semiconductor laser module according to claim 12, wherein the difference between a central wavelength of gain spectrum of said semiconductor laser device and a central wavelength of reflection of said diffraction grating is ±20 nm or less.

15. A semiconductor laser module according to claim 1, wherein said semiconductor laser device has a multimode emission spectrum.

16. A semiconductor laser module according to claim 15, wherein the difference between a central wavelength of gain spectrum of said semiconductor laser device and a central wavelength of reflection of said diffraction grating is ±20 nm or less.

17. A semiconductor laser module according to claim 1, wherein the difference between a central wavelength of gain spectrum of said semiconductor laser device and a central wavelength of reflection of said diffraction grating is ±20 nm or less.

18. A semiconductor laser module according to claim 1, wherein the half width at half maximum of gain spectrum band of said semiconductor laser device is 10 nm or larger.

19. A semiconductor laser module according to claim 1, wherein the difference between a reflectance $R_{GL}$ of said diffraction grating at a central wavelength $\lambda Fg$ of reflection and a reflectance $R_1$ of said first multilayer coating at a central wavelength of reflection satisfies a condition $R_{GL} - R_1 \geq -2\%$.

20. A semiconductor laser module according to claim 1, wherein optical coupling means having a power coupling efficiency of 50% or higher is provided between said emitting surface of said semiconductor laser device and said optical feedback medium.

* * * * *